US012648295B2

(12) United States Patent
Yoshizumi et al.

(10) Patent No.: US 12,648,295 B2
(45) Date of Patent: Jun. 2, 2026

(54) LIGHT-EMITTING DEVICE, PHOTOELECTRIC CONVERSION DEVICE, DISPLAY DEVICE, LIGHT-EMITTING APPARATUS

(71) Applicant: SEMICONDUCTOR ENERGY LABORATORY CO., LTD., Atsugi (JP)

(72) Inventors: Hideko Yoshizumi, Atsugi (JP); Ryo Narukawa, Hadano (JP); Satoko Numata, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 987 days.

(21) Appl. No.: 17/841,856

(22) Filed: Jun. 16, 2022

(65) Prior Publication Data

US 2023/0018126 A1 Jan. 19, 2023

(30) Foreign Application Priority Data

Jun. 25, 2021 (JP) ................................ 2021-105470

(51) Int. Cl.
*H10K 50/15* (2023.01)
*H10K 50/16* (2023.01)
(Continued)

(52) U.S. Cl.
CPC ......... *H10K 50/156* (2023.02); *H10K 50/166* (2023.02); *H10K 85/654* (2023.02);
(Continued)

(58) Field of Classification Search
CPC ........ H10K 30/50; H10K 30/53; H10K 30/57; H10K 30/00; H10K 30/20; H10K 30/211;
(Continued)

(56) References Cited

U.S. PATENT DOCUMENTS 7,649,077 B2 1/2010 Craig et al.
8,012,602 B2 9/2011 Schafer et al.
(Continued)

FOREIGN PATENT DOCUMENTS

| | | | | |
|---|---|---|---|---|
| JP | 2016-153400 A | | 8/2016 | |
| WO | WO-2019229583 A1 | * | 12/2019 | ............ C09K 11/06 |
| WO | WO-2021130629 A1 | * | 7/2021 | ........... H10K 59/878 |

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

*Primary Examiner* — Michael M Dollinger
(74) *Attorney, Agent, or Firm* — Fish & Richardson P.C.

(57) ABSTRACT

A novel light-emitting device that is highly convenient, useful, or reliable is provided. The light-emitting device includes a first electrode, a second electrode, and a first unit. The first unit is located between the first electrode and the second electrode, and the first unit has a function of emitting light. The first unit contains a light-emitting organic compound and an organic compound HRM. The organic compound HRM has four or more rotatable bonds and a principal moment of inertia. The principal moment of inertia includes a first normalized principal moment of inertia NPR1 and a second normalized principal moment of inertia NPR2 in a predetermined region.

4 Claims, 22 Drawing Sheets

(51) Int. Cl.
*H10K 85/60* (2023.01)
*H10K 59/80* (2023.01)
*H10K 101/00* (2023.01)
*H10K 102/00* (2023.01)

(52) U.S. Cl.
CPC ....... *H10K 85/6572* (2023.02); *H10K 59/871* (2023.02); *H10K 59/876* (2023.02); *H10K 2101/00* (2023.02); *H10K 2102/351* (2023.02)

(58) Field of Classification Search
CPC .... H10K 30/30; H10K 50/11; H10K 85/6572; H10K 85/6576; H10K 85/615; H10K 50/16; H10K 2101/30; H10K 85/654; H10K 85/6574; H10K 85/342; H10K 2101/10; H10K 85/626; H10K 85/636; H10K 85/633; H10K 2101/40; H10K 85/657; H10K 50/15; H10K 50/166; H10K 50/19; H10K 59/35; H10K 50/00; H10K 50/17; H10K 50/82; H10K 85/631; H10K 2101/90; H10K 59/12; H10K 50/13; H10K 50/81; H10K 50/171; H10K 85/30; H10K 2101/20; H10K 50/156; H10K 59/00; H10K 85/622; H10K 50/12; H10K 59/32; H10K 59/90; H10K 50/131; H10K 50/165; H10K 85/624; H10K 59/876; H10K 59/351; H10K 59/8051; H10K 71/233; H10K 2101/25; H10K 85/346; H10K 85/60; H10K 59/40; H10K 59/8052; H10K 2102/351; H10K 71/00; H10K 59/122; H10K 59/879; H10K 85/656; H10K 85/40; H10K 50/844; H10K 59/1213; H10K 2101/27; H10K 50/858; H10K 59/121; H10K 85/371; H10K 59/1201; H10K 71/16; H10K 50/805; H10K 59/131; H10K 59/38; H10K 50/10; H10K 85/111; H10K 50/121; H10K 50/155; H10K 50/18; H10K 50/852; H10K 59/875; H10K 85/621; H10K 50/818; H10K 85/655; H10K 50/181; H10K 71/135; H10K 77/10; H10K 59/8722; H10K 65/00; H10K 85/658; H10K 59/805; H10K 71/40; H10K 71/60; H10K 2102/3026; H10K 59/10; H10K 85/00; H10K 39/34; H10K 59/123; H10K 59/13; H10K 30/60; H10K 30/81; H10K 59/30; H10K 59/878; H10K 71/20; H10K 85/649; H10K 2101/80; H10K 39/32; H10K 59/17; H10K 59/65; H10K 85/1135; H10K 85/322; H10K 85/50; H10K 85/653; H10K 50/115; H10K 50/125; H10K 50/84; H10K 59/771; H10K 59/80518; H10K 2102/301; H10K 2102/341; H10K 50/157; H10K 50/841; H10K 59/352; H10K 59/60; H10K 59/80521; H10K 59/80524; H10K 85/20; H10K 85/623; H10K 50/828; H10K 59/873; H10K 59/8792; H10K 71/13; H10K 50/14; H10K 59/124; H10K 59/353; H10K 59/80522; H10K 59/95; H10K 71/164; H10K 2101/00; H10K 2101/50; H10K 59/8731; H10K 85/311; H10K 85/652; H10K 10/40; H10K 10/46; H10K 30/353; H10K 50/80; H10K 50/8426; H10K 59/87; H10K 71/221; H10K 71/811; H10K 85/351; H10K 10/00; H10K 2102/00; H10K 2102/321; H10K 2102/361; H10K 30/40; H10K 39/00; H10K 39/30; H10K 50/856; H10K 59/1216; H10K 59/80516; H10K 59/871; H10K 71/12; H10K 71/70; H10K 85/113; H10K 85/381; H10K 99/00; H10K 2102/331; H10K 30/85; H10K 39/38; H10K 39/501; H10K 50/167; H10K 50/85; H10K 50/87; H10K 59/80515; H10K 59/80517; H10K 59/80523; H10K 71/231; H10K 71/621; H10K 85/10; H10K 85/211; H10K 85/324; H10K 85/611; H10K 85/625; H10K 30/865; H10K 50/826; H10K 71/166; H10K 2102/10; H10K 50/88; H10K 59/173; H10K 59/80; H10K 71/15; Y02E 10/549
See application file for complete search history.

(56) References Cited

U.S. PATENT DOCUMENTS

| | | | | |
|---|---|---|---|---|
| 9,087,964 | B2 | 7/2015 | Hatano et al. | |
| 9,147,849 | B2 | 9/2015 | Nam et al. | |
| 9,209,355 | B2 | 12/2015 | Senda et al. | |
| 9,231,042 | B2 | 1/2016 | Nishido et al. | |
| 10,476,009 | B2 | 11/2019 | Yamada et al. | |
| 2010/0240892 | A1 | 9/2010 | Schafer et al. | |
| 2012/0274201 | A1 | 11/2012 | Seo et al. | |
| 2013/0165653 | A1 | 6/2013 | Inoue et al. | |
| 2014/0054561 | A1 | 2/2014 | Nam et al. | |
| 2014/0103385 | A1 | 4/2014 | Hatano et al. | |
| 2014/0175469 | A1 | 6/2014 | Dozen et al. | |
| 2014/0231770 | A1 | 8/2014 | Inoue et al. | |
| 2015/0041792 | A1 | 2/2015 | Suzuki et al. | |
| 2015/0041795 | A1 | 2/2015 | Suzuki et al. | |
| 2015/0351168 | A1 | 12/2015 | Yasumoto et al. | |
| 2016/0181550 | A1 | 6/2016 | Yamada et al. | |
| 2016/0240794 | A1* | 8/2016 | Yamada | H10K 85/626 |
| 2016/0248024 | A1* | 8/2016 | Shin | H10K 85/6574 |
| 2016/0308139 | A1 | 10/2016 | Seo et al. | |
| 2016/0336519 | A1* | 11/2016 | Seo | H10K 50/166 |
| 2017/0288154 | A1 | 10/2017 | Seo et al. | |
| 2018/0108847 | A1 | 4/2018 | Suzuki et al. | |
| 2021/0313520 | A1 | 10/2021 | Seo et al. | |
| 2021/0363151 | A1* | 11/2021 | Seo | H10K 85/6574 |
| 2022/0393123 | A1* | 12/2022 | Kubota | H10K 59/60 |
| 2023/0088427 | A1* | 3/2023 | Nakamura | H05B 33/12<br>345/173 |

* cited by examiner

LIGHT-EMITTING DEVICE, PHOTOELECTRIC CONVERSION DEVICE, DISPLAY DEVICE, LIGHT-EMITTING APPARATUS

BACKGROUND OF THE INVENTION

1. Field of the Invention

One embodiment of the present invention relates to a light-emitting device, a photoelectric conversion device, a display device, an electronic device, a light-emitting apparatus, or a lighting device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting apparatus, a power storage device, a memory device, a method for driving any of them, and a method for manufacturing any of them.

2. Description of the Related Art

Light-emitting devices (organic EL devices) including organic compounds and utilizing electroluminescence (EL) have been put to more practical use. In the basic structure of such light-emitting devices, an organic compound layer containing a light-emitting material (an EL layer) is located between a pair of electrodes. Carriers (holes and electrons) are injected by application of voltage to the device, and recombination energy of the carriers is used, whereby light emission can be obtained from the light-emitting material.

Such light-emitting devices are of self-luminous type and thus have advantages over liquid crystal displays, such as high visibility and no need for backlight when used as pixels of a display, and are suitable as flat panel display devices. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps or LEDs or linear light sources typified by fluorescent lamps; thus, such light-emitting devices also have great potential as planar light sources, which can be applied to lighting devices and the like.

Displays or lighting devices including light-emitting devices are suitable for a variety of electronic devices as described above, and research and development of light-emitting devices have progressed for better characteristics.

As an organic compound that can be used as an electron-injection material or an electron-transport material of a light-emitting device, an organic compound having two or three benzo[h]quinazoline rings is known (Patent Document 1).

For a display portion of a display device for augmented reality or virtual reality, an organic EL device is used in some cases. Non-Patent Document 1 discloses a method employing standard UV photolithography for manufacturing an organic optoelectronic device, which is one of organic EL devices.

REFERENCE

[Patent Document 1] Japanese Published Patent Application No. 2016-153400

Non-Patent Document

[Non-Patent Document 1] B. Lamprecht et al., "Organic optoelectronic device fabrication using standard UV photolithography" *phys. stat. sol.* (*RRL*) 2, No. 1, 2008, pp. 16-18

SUMMARY OF THE INVENTION

An object of one embodiment of the present invention is to provide a novel light-emitting device that is highly convenient, useful, or reliable. Another object is to provide a novel photoelectric conversion device that is highly convenient, useful, or reliable. Another object is to provide a novel display device that is highly convenient, useful, or reliable. Another object is to provide a novel electronic device that is highly convenient, useful, or reliable. Another object is to provide a novel light-emitting apparatus that is highly convenient, useful, or reliable. Another object is to provide a novel lighting device that is highly convenient, useful, or reliable. Another object is to provide a novel light-emitting device, a novel photoelectric conversion device, a novel display device, a novel electronic device, a novel light-emitting apparatus, a novel lighting device, or a novel semiconductor device.

Note that the description of these objects does not preclude the existence of other objects. In one embodiment of the present invention, there is no need to achieve all these objects. Other objects will be apparent from and can be derived from the description of the specification, the drawings, the claims, and the like.

(1) One embodiment of the present invention is a light-emitting device including a first electrode, a second electrode, and a first unit.

The first unit is located between the first electrode and the second electrode, and the first unit has a function of emitting light. The first unit contains a light-emitting organic compound and an organic compound HRM.

The organic compound HRM has four or more rotatable bonds and a principal moment of inertia. The principal moment of inertia includes a first normalized principal moment of inertia NPR1 and a second normalized principal moment of inertia NPR2. The first normalized principal moment of inertia NPR1 and the second normalized principal moment of inertia NPR2 are in a region surrounded by straight lines represented by formulae shown below.

[Formulae 1]

$$NPR2 \leq NPR1+0.95 \quad (1)$$

$$NPR2 \geq NPR1+0.65 \quad (2)$$

$$NPR2 \leq -NPR1+1.05 \quad (3)$$

$$NPR2 \geq -NPR1+1.00 \quad (4)$$

Note that the first normalized principal moment of inertia NPR1 and the second normalized principal moment of inertia NPR2 are values obtained by dividing elements other than the largest element of the principal moment of inertia by the largest element. The second normalized principal moment of inertia NPR2 is greater than or equal to the first normalized principal moment of inertia NPR1.

Thus, the organic compound HRM with a shape close to a linear shape between the linear shape and a circular shape can be used for the first unit. Furthermore, the first unit can have improved heat resistance. As a result, a novel light-emitting device that is highly convenient, useful, or reliable can be provided.

(2) Another embodiment of the present invention is the light-emitting device in which the organic compound HRM has a polar surface area of 30 Å$^2$ or larger. Note that 1 Å is $10^{-10}$ m.

Accordingly, the first unit can have improved heat resistance. In addition, electrons can be easily transferred in the first unit. As a result, a novel light-emitting device that is highly convenient, useful, or reliable can be provided.

(3) Another embodiment of the present invention is the light-emitting device in which the first unit includes a first layer, a second layer, and a third layer. The first layer is located between the second layer and the third layer and contains a light-emitting organic compound. The third layer is located between the second electrode and the first layer and contains the organic compound HRM.

Accordingly, the third layer can have improved heat resistance. In addition, electrons can be easily transferred in the third layer. As a result, a novel light-emitting device that is highly convenient, useful, or reliable can be provided.

(4) Another embodiment of the present invention is the light-emitting device in which the organic compound HRM has a molecular weight of greater than or equal to 550 and less than or equal to 850.

Accordingly, the first unit can have improved heat resistance. In addition, a film containing the organic compound HRM can be formed by an evaporation method. As a result, a novel light-emitting device that is highly convenient, useful, or reliable can be provided.

(5) Another embodiment of the present invention is a photoelectric conversion device including a third electrode, a fourth electrode, and a second unit.

The second unit is located between the third electrode and the fourth electrode, and the second unit has a photoelectric conversion function. The second unit contains an electron-donating material, an electron-accepting material, and an organic compound HRM.

The organic compound HRM has four or more rotatable bonds and a principal moment of inertia. The principal moment of inertia includes a first normalized principal moment of inertia NPR1 and a second normalized principal moment of inertia NPR2. The first normalized principal moment of inertia NPR1 and the second normalized principal moment of inertia NPR2 are in a region surrounded by straight lines represented by formulae shown below.

[Formulae 2]

$$NPR2 \leq NPR1 + 0.95 \quad (1)$$

$$NPR2 \geq NPR1 + 0.65 \quad (2)$$

$$NPR2 \leq -NPR1 + 1.05 \quad (3)$$

$$NPR2 \geq -NPR1 + 1.00 \quad (4)$$

Note that the first normalized principal moment of inertia NPR1 and the second normalized principal moment of inertia NPR2 are values obtained by dividing elements other than the largest element of the principal moment of inertia by the largest element. The second normalized principal moment of inertia NPR2 is greater than or equal to the first normalized principal moment of inertia NPR1.

Thus, the organic compound HRM with a shape close to a linear shape between the linear shape and a circular shape can be used for the second unit. Furthermore, the second unit can have improved heat resistance. As a result, a novel photoelectric conversion device that is highly convenient, useful, or reliable can be provided.

(6) Another embodiment of the present invention is the photoelectric conversion device in which the organic compound HRM has a polar surface area of 30 Å$^2$ or larger.

Accordingly, the second unit can have improved heat resistance. In addition, electrons can be easily transferred in the second unit. As a result, a novel photoelectric conversion device that is highly convenient, useful, or reliable can be provided.

(7) Another embodiment of the present invention is the photoelectric conversion device in which the second unit includes a fourth layer, a fifth layer, and a sixth layer. The fourth layer is located between the fifth layer and the sixth layer and contains an electron-donating material and an electron-accepting material. The sixth layer is located between the fourth electrode and the fourth layer and contains the organic compound HRM.

Accordingly, the sixth layer can have improved heat resistance. In addition, electrons can be easily transferred in the sixth layer. As a result, a novel photoelectric conversion device that is highly convenient, useful, or reliable can be provided.

(8) Another embodiment of the present invention is the photoelectric conversion device in which the organic compound HRM has a molecular weight of greater than or equal to 550 and less than or equal to 850.

Accordingly, the second unit can have improved heat resistance. In addition, a film containing the organic compound HRM can be formed by an evaporation method. As a result, a novel photoelectric conversion device that is highly convenient, useful, or reliable can be provided.

(9) Another embodiment of the present invention is a display device including a first light-emitting device, a second light-emitting device, a conductive film, and an insulating film. The first light-emitting device has the structure of the above-described light-emitting device. The second light-emitting device is adjacent to the first light-emitting device.

The second light-emitting device includes a fifth electrode, a sixth electrode, and a third unit. The third unit is located between the sixth electrode and the fifth electrode.

The conductive film electrically connects the second electrode to the sixth electrode.

The first electrode is located between the first unit and the insulating film, and the fifth electrode is located between the third unit and the insulating film. A first space is provided between the fifth electrode and the first electrode, and the first space is located between the conductive film and the insulating film.

(10) Another embodiment of the present invention is the display device in which the first light-emitting device includes a seventh layer. The seventh layer is located between the first unit and the first electrode.

The seventh layer contains an electron-accepting substance and a hole-transport material, and the seventh layer has an electrical resistivity greater than or equal to $1\times10^{2}$ [Ω·cm] and less than or equal to $1\times10^{8}$ [Ω·cm].

The second light-emitting device includes an eighth layer, and the eighth layer is located between the third unit and the fifth unit. A second space is provided between the eighth layer and the seventh layer.

The eighth layer contains an electron-accepting substance and a hole-transport material.

Consequently, current flowing between the seventh layer and the eighth layer can be suppressed. In addition, occurrence of crosstalk between the first light-emitting device and the second light-emitting device can be suppressed. The second light-emitting device can be separated from the first light-emitting device. As a result, a novel display device that is highly convenient, useful, or reliable can be provided.

(11) Another embodiment of the present invention is the display device further including a filler.

The filler is located between the first electrode and the fifth electrode, between the insulating film and the conductive film, and between the first unit and the third unit.

Accordingly, the second light-emitting device can be separated from the first light-emitting device. A space formed between the first light-emitting device and the second light-emitting device can be filled with a filler. A step due to the space formed between the first light-emitting device and the second light-emitting device can be reduced. A step generated in the conductive film can be reduced. A phenomenon in which a cut or a split is generated along the step in the conductive film can be suppressed. As a result, a novel display device that is highly convenient, useful, or reliable can be provided.

(12) One embodiment of the present invention is a display device which includes the above-described light-emitting device and a transistor or a substrate.

(13) One embodiment of the present invention is an electronic device which includes the above-described display device, and a sensor, an operation button, a speaker, or a microphone.

(14) One embodiment of the present invention is a light-emitting apparatus which includes the above-described light-emitting device and a transistor or a substrate.

(15) One embodiment of the present invention is a lighting device which includes the above-described light-emitting apparatus and a housing.

Although the block diagram in drawings attached to this specification shows components classified based on their functions in independent blocks, it is difficult to classify actual components based on their functions completely, and one component can have a plurality of functions.

Note that the light-emitting apparatus in this specification includes, in its category, an image display device that uses a light-emitting element. The light-emitting apparatus may also include a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. Furthermore, a lighting device or the like may include the light-emitting apparatus.

With one embodiment of the present invention, a novel light-emitting device that is highly convenient, useful, or reliable can be provided. A novel photoelectric conversion device that is highly convenient, useful, or reliable can be provided. A novel display device that is highly convenient, useful, or reliable can be provided. A novel electronic device that is highly convenient, useful, or reliable can be provided. A novel light-emitting apparatus that is highly convenient, useful, or reliable can be provided. A novel lighting device that is highly convenient, useful, or reliable can be provided. A novel light-emitting device, a novel photoelectric conversion device, a novel display device, a novel electronic device, a novel light-emitting apparatus, a novel lighting device, or a novel semiconductor device can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
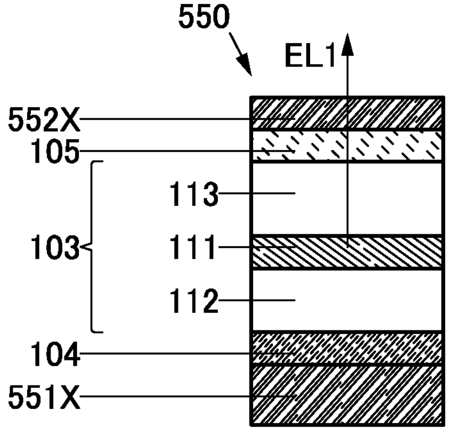
FIG. 1A illustrates a structure of a light-emitting device of an embodiment.

A light-emitting device of one embodiment of the present invention includes a first electrode, a second electrode, and a first unit. The first unit is located between the first electrode and the second electrode, and the first unit has a function of emitting light. The first unit contains a light-emitting organic compound and an organic compound HRM. The organic compound HRM has four or more rotatable bonds and a principal moment of inertia. The principal moment of inertia includes a first normalized principal moment of inertia NPR1 and a second normalized principal moment of inertia NPR2 in a predetermined region.

Thus, the organic compound HRM with a shape close to a linear shape between the linear shape and a circular shape can be used for the first unit. Furthermore, the first unit can have improved heat resistance. As a result, a novel light-emitting device that is highly convenient, useful, or reliable can be provided.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a light-emitting device of one embodiment of the present invention is described with reference to FIG. 1A.

Figure 1B:
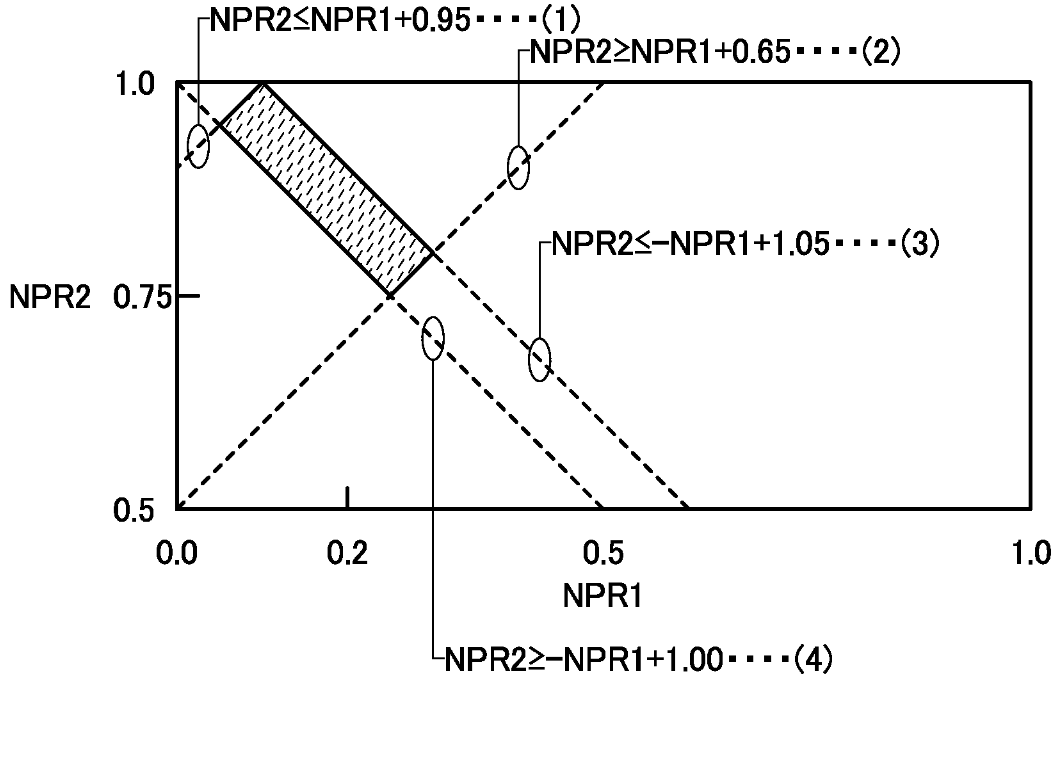
FIG. 1B illustrates a shape of an organic compound that can be used for a light-emitting device of an embodiment.

FIG. 1A is a cross-sectional view illustrating a structure of a light-emitting device 550 of one embodiment of the present invention, and FIG. 1B illustrates a shape of an organic compound HRM that can be used for the light-emitting device 550 of one embodiment of the present invention.

In this specification, an integer variable of 1 or more may be used for reference numerals. For example, "(p)" where p is an integer variable of 1 or more may be used for part of a reference numeral that specifies any one of up top components. For another example, "(m,n)" where each of m and n is an integer variable of 1 or more may be used for part of a reference numeral that specifies any one of up to m×n components.

<Structure Example 1 of Light-Emitting Device>

The light-emitting device described in this embodiment includes an electrode 551X, an electrode 552X, and a unit 103 (see FIG. 1A). The unit 103 is located between the electrode 551X and the electrode 552X.

<Structure Example 1 of Unit 103>

The unit 103 has a single-layer structure or a stacked-layer structure and has a function of emitting light.

For example, a layer selected from functional layers such as a light-emitting layer, a hole-transport layer, an electron-transport layer, and a carrier-blocking layer can be used for the unit 103. A layer selected from functional layers such as a hole-injection layer, an electron-injection layer, an exciton-blocking layer, and a charge-generation layer can also be used for the unit 103.

The unit 103 contains a light-emitting organic compound EM and the organic compound HRM.

[Structure Example 1 of Organic Compound HRM]

The organic compound HRM has four or more rotatable bonds.

The organic compound HRM has a principal moment of inertia PMI.

Note that the principal moment of inertia PMI of an organic compound is calculated from an atomic coordinate in a three-dimensional structure, specifically, obtained by calculating a diagonal element of an inertia matrix (tensor) that is diagonalized so that an inertia constant is 0. For example, the principal moment of inertia PMI can be calculated from an atomic coordinate in Standard orientation calculated using Gaussian, which is the quantum chemistry calculation software. Alternatively, it is possible to use a three-dimensional coordinate of a molecule that is calculated using RDKit, which is the open source software.

The principal moment of inertia PMI of the organic compound HRM includes a first normalized principal moment of inertia NPR1 and a second normalized principal moment of inertia NPR2. The first normalized principal moment of inertia NPR1 and the second normalized principal moment of inertia NPR2 are positioned in a region surrounded by straight lines represented by the following formulae.

[Formulae 3]

$$NPR2 \le NPR1 + 0.95 \quad (1)$$

$$NPR2 \ge NPR1 + 0.65 \quad (2)$$

$$NPR2 \le -NPR1 + 1.05 \quad (3)$$

$$NPR2 \ge -NPR1 + 1.00 \quad (4)$$

The first normalized principal moment of inertia NPR1 and the second normalized principal moment of inertia NPR2 are values obtained by dividing elements other than the largest element of the principal moment of inertia PMI by the largest element. The second normalized principal moment of inertia NPR2 is greater than or equal to the first normalized principal moment of inertia NPR1.

In accordance with the above-described rule, the first normalized principal moment of inertia NPR1 and the second normalized principal moment of inertia NPR2 can be calculated from the principal moment of inertia PMI. In addition, by plotting the second normalized principal moment of inertia NPR2 with respect to the first normalized principal moment of inertia NPR1, the shape of an organic compound whose principal moment of inertia PMI is calculated can be expressed and identified.

For example, a linear shape is typically plotted on a coordinate (0, 1) of a NPR1-NPR2 plane (see FIG. 1B). A circular shape is typically plotted on a coordinate (0.5, 0.5) of the NPR1-NPR2 plane. A spherical shape is typically plotted on a coordinate (1, 1) of the NPR1-NPR2 plane.

In other words, a region represented by the above formulae identifies and expresses a shape close to a linear shape between the linear shape and a circular shape. That is, the organic compound HRM having the principal moment of inertia PMI including the first normalized principal moment of inertia NPR1 and the second normalized principal moment of inertia NPR2 in the region represented by the above formulae has a shape close to a linear shape between the linear shape and a circular shape.

Note that in this specification, an organic compound having a first normalized principal moment of inertia NPR1 and a second normalized principal moment of inertia NPR2 that are obtained from a principal moment of inertia PMI and positioned in the region surrounded by the straight lines represented by Formulae (1) to (4) above is referred to as an "organic compound HRM" for convenience.

As described above, the organic compound HRM with a shape close to a linear shape between the linear shape and a circular shape can be used for the unit 103. Accordingly, the unit 103 can have improved heat resistance. As a result, a novel light-emitting device that is highly convenient, useful, or reliable can be provided.

[Structure Example 2 of Organic Compound HRM]

The organic compound HRM has a polar surface area (PSA) of 30 Å$^2$ or larger.

Accordingly, the unit 103 can have improved heat resistance. In addition, electrons can be easily transferred in the unit 103. As a result, a novel light-emitting device that is highly convenient, useful, or reliable can be provided.

>Structure Example 2 of Unit 103<

The unit 103 includes a layer 111, a layer 112, and a layer 113. The layer 111 is located between the layer 112 and the layer 113, and the layer 111 contains the light-emitting organic compound EM (see FIG. 1A).

<<Structure Example 1 of Layer 111>>

For example, the layer 111 contains a light-emitting material. Alternatively, a light-emitting material and a host material can be used for the layer 111. The layer 111 can be referred to as a light-emitting layer. The layer 111 is preferably provided in a region where holes and electrons are recombined. This allows efficient conversion of energy generated by recombination of carriers into light and emission of the light.

Furthermore, the layer 111 is preferably provided apart from a metal used for the electrode or the like. In that case, a quenching phenomenon caused by the metal used for the electrode or the like can be inhibited.

It is preferable that a distance from an electrode or the like having reflectivity to the layer 111 be adjusted and the layer 111 be placed in an appropriate position in accordance with an emission wavelength. With this structure, the amplitude can be increased by utilizing an interference phenomenon between light reflected by the electrode or the like and light emitted from the layer 111. Light with a predetermined wavelength can be intensified and the spectrum of the light can be narrowed. In addition, bright light emission colors with high intensity can be obtained. In other words, the layer 111 is placed in an appropriate position, for example, between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as light EL1 from the light-emitting material (see FIG. 1A).

[Fluorescent Substance]

A fluorescent substance can be used for the layer 111. For example, the following fluorescent substances can be used for the layer 111. Note that fluorescent substances that can be used for the layer 111 are not limited to the following, and a variety of known fluorescent substances can be used.

Specifically, any of the following fluorescent substances can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N"-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02), 3,10-bis[N-(dibenzofuran-3-yl)-N-phenylamino]naphtho[2,3-b; 6,7-b']benzofuran (abbreviation: 3,10FrA2Nbf(IV)-02), and the like.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Other examples of fluorescent substances include N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, 9,10-diphenyl-2-[N-phenyl-N-(9-phenyl-carbazol-3-yl)-amino]-anthracene (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N"-triphenyl-1,4-phenylenediamine (abbreviation: 2DPAPA), N-[9,10-bis(1,1'-biphenyl-2-yl)-2-anthryl]-N,N',N"-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), coumarin 545T, N,N'-diphenylquinacridone (abbreviation: DPQd), rubrene, and 5,12-bis(1,1'-biphenyl-4-yl)-6,11-diphenyltetracene (abbreviation: BPT).

Other examples of fluorescent substances include 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo quinolizin-9-yl)ethenyl]-4H-pyran-4-ylidene}propanedinitrile (abbreviation: BisDCJTM).

[Phosphorescent Substance]

A phosphorescent substance can be used for the layer 111. For example, phosphorescent substances described below as examples can be used for the layer 111. Note that phosphorescent substances that can be used for the layer 111 are not limited to the following, and a variety of known phosphorescent substances can be used for the layer 111.

For example, any of the following can be used for the layer 111: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz\text{-}3b)_3]$), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: $[Ir(Mptz1\text{-}mp)_3]$), tris(1-methyl-5-phenyl-3-propyl-1H-1,2,4-triazolatoliridium(III) (abbreviation: $[Ir(Prptz1\text{-}Me)_3]$), or the like can be used.

As an organometallic iridium complex having an imidazole skeleton or the like, fac-tris[1-(2,6-diisopropylphenyl)-2-phenyl-1H-imidazole]iridium(III) (abbreviation: $[Ir(iPrpmi)_3]$), tris[3-(2,6-dimethylphenyl)-7-methylimidazo[1,2-f]phenanthridinato]iridium(III) (abbreviation: $[Ir(dmpimpt\text{-}Me)_3]$), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $Ir(CF_3ppy)_2(pic)$), bis[2-(4',6'-difluorophenyl)pyridinato-N,$C^{2'}$]iridium(III) acetylacetonate (abbreviation: FIracac), or the like can be used.

These substances are compounds exhibiting blue phosphorescent light and having an emission wavelength peak at 440 nm to 520 nm.

[Phosphorescent Substance (Green)]

As an organometallic iridium complex having a pyrimidine skeleton or the like, tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato)bis(4,6-diphenylpyrimidinato)iridium(III) (abbreviation: $[Ir(dppm)_2(acac)]$), or the like can be used.

As an organometallic iridium complex having a pyrazine skeleton or the like, (acetylacetonato)bis(3,5-dimethyl-2-phenylpyrazinato)iridium(III) (abbreviation: $[Ir(mppr\text{-}Me)_2(acac)]$), (acetylacetonato)bis(5-isopropyl-3-methyl-2-phenylpyrazinato)iridium(III) (abbreviation: $[Ir(mppr\text{-}iPr)_2(acac)]$), or the like can be used.

As an organometallic iridium complex having a pyridine skeleton or the like, tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), [2-d3-methyl-8-(2-pyridinyl-κN)benzofuro[2,3-b]pyridine-KC]bis[2-(5-d3-methyl-2-pyridinyl-κN)phenyl-κC]iridium(III) (abbreviation: $[Ir(5mppy\text{-}d3)_2(mbfpypy\text{-}d3)]$), [2-d3-methyl-(2-pyridinyl-κN)benzofuro[2,3-b]pyridine-KC]bis[2-(2-pyridinyl-κN)phenyl-κC]iridium(III) (abbreviation: $[Ir(ppy)_2(mbfpypy\text{-}d3)]$), or the like can be used.

Examples of a rare earth metal complex are tris(acetylacetonato) (monophenanthroline)terbium(III) (abbreviation: $Tb(acac)_3(Phen)$), and the like.

These are compounds that mainly exhibit green phosphorescent light and have an emission wavelength peak at 500 nm to 600 nm. Note that an organometallic iridium complex having a pyrimidine skeleton has distinctively high reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), bis[4,6-di(naphthalen-1-yl)pyrimidinato](dipivaloylmethanato)iridium(III) (abbreviation: $[Ir(d1npm)_2(dpm)]$), or the like can be used.

As an organometallic iridium complex having a pyrazine skeleton or the like, (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), (acetylacetonato)bis[2,3-bis(4-fluorophenyl)quinoxalinato]iridium(III) (abbreviation: $[Ir(Fdpq)_2(acac)]$), or the like can be used.

As an organometallic iridium complex having a pyridine skeleton or the like, tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), or the like can be used.

As a rare earth metal complex or the like, tris(1,3-diphenyl-1,3-propanedionato)(monophenanthroline)europium(III) (abbreviation: $[Eu(DBM)_3(Phen)]$), tris[1-(2-thenoyl)-3,3,3-trifluoroacetonato](monophenanthroline)europium(III) (abbreviation: $[Eu(TTA)_3(Phen)]$), or the like can be used.

As a platinum complex or the like, 2,3,7,8,12,13,17,18-octaethyl-21H,23H-porphyrin platinum(II) (abbreviation: PtOEP) or the like can be used.

These compounds emit red phosphorescent light having an emission peak at 600 nm to 700 nm. Furthermore, the organometallic iridium complexes having a pyrazine skeleton can provide red light emission with chromaticity favorably used for display devices.

[Substance Exhibiting Thermally Activated Delayed Fluorescence (TADF)]

A TADF material can be used for the layer 111. For example, any of the TADF materials enumerated below can be used as the light-emitting material. Note that TADF materials that can be used as the light-emitting material are not limited to the following, and a variety of known TADF materials can be used as the light-emitting material.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Specifically, the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formulae 1]

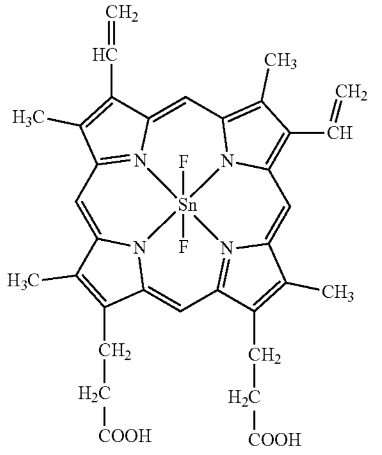

$SnF_2$(Proto IX)

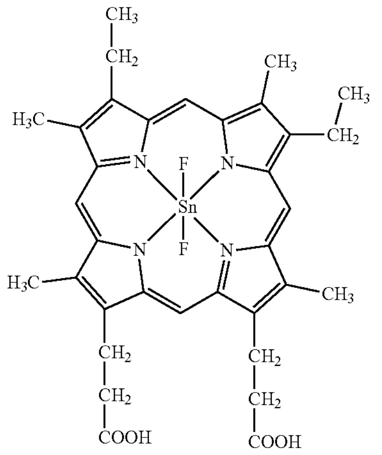

$SnF_2$(Meso IX)

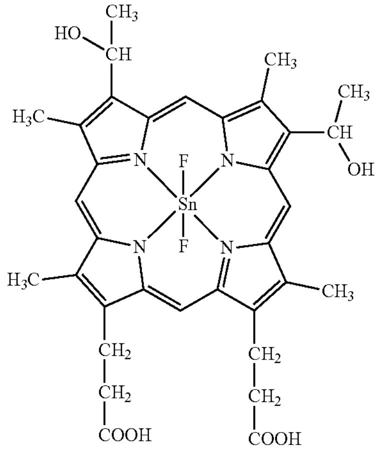

$SnF_2$(Hemato IX)

-continued

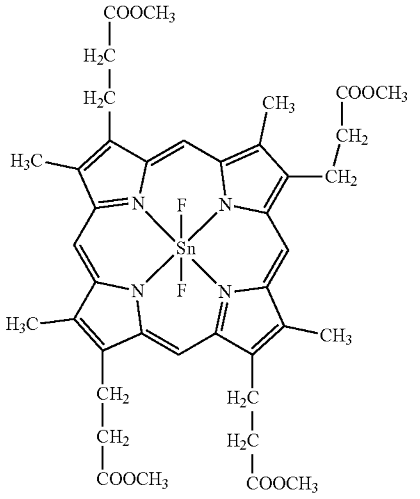

$SnF_2$(Copro III-4Me)

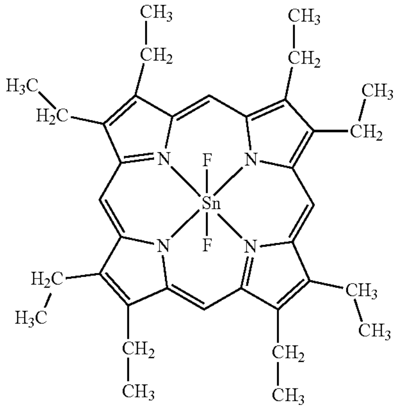

$SnF_2$(OEP)

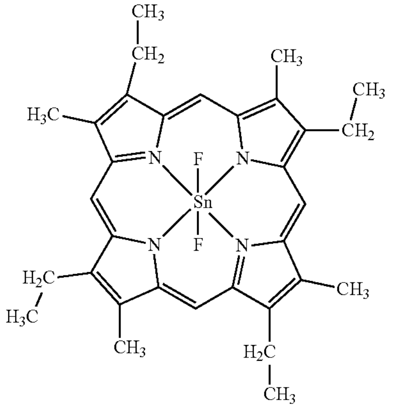

$SnF_2$(Etio I)

-continued

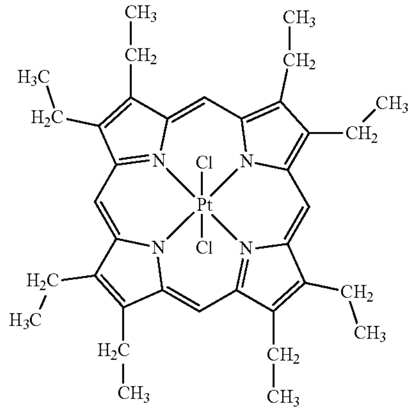

$PtCl_2OEP$

Furthermore, a heterocyclic compound including one or both of a π-electron rich heteroaromatic ring and a π-electron deficient heteroaromatic ring can be used, for example, as the TADF material.

Specifically, the following compounds whose structural formulae are shown below can be used: 2-(biphenyl-4-yl)-4,6-bis(12-phenylindolo[2,3-α]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formulae 2]

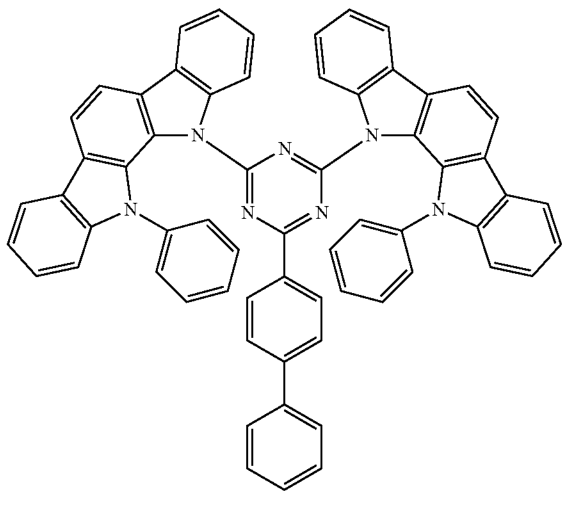

PIC-TRZ

-continued

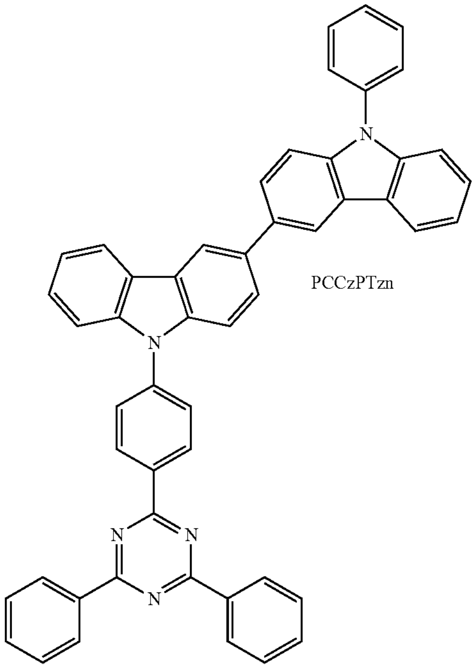

PCCzPTzn

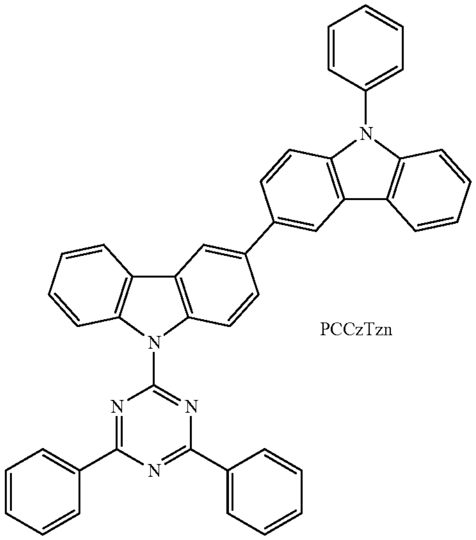

PCCzTzn

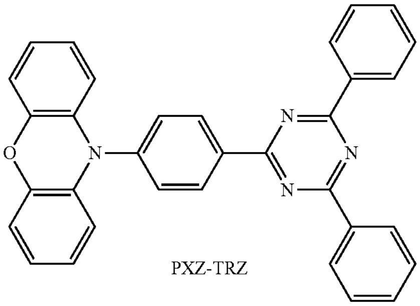

PXZ-TRZ

-continued

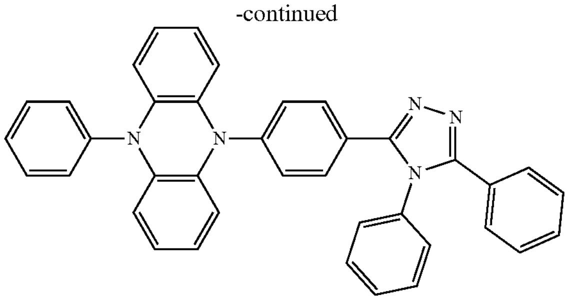

PPZ-3TPT

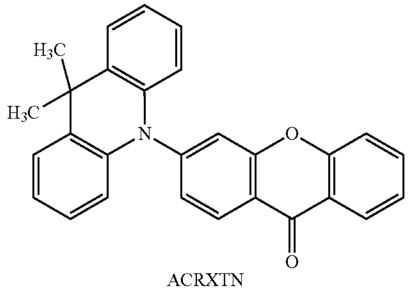

ACRXTN

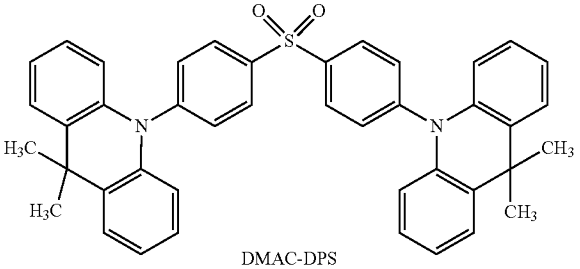

DMAC-DPS

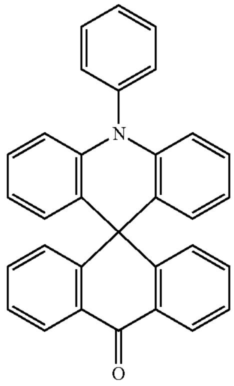

ACRSA

Such a heterocyclic compound is preferable because of having high electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

<<Structure Example 2 of Layer 111>>

A carrier-transport material can be used as the host material. For example, a hole-transport material, an electron-transport material, a TADF material, a material having an anthracene skeleton, or a mixed material can be used as the host material. A material having a wider bandgap than the light-emitting material contained in the layer 111 is preferably used as the host material. Thus, transfer of energy from excitons generated in the layer 111 to the host material can be inhibited.

[Hole-Transport Material]

A material having a hole mobility of $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

The following are examples that can be used as a compound having an aromatic amine skeleton: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF).

As a compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), or the like can be used.

As a compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or the like can be used.

As a compound having a furan skeleton, for example, 4,4',4"-(benzene-1,3,5-triyl)tri(dibenzofuran) (abbreviation: DBF3P-II), 4-{3-[3-(9-phenyl-9H-fluoren-9-yl)phenyl]phenyl}dibenzofuran (abbreviation: mmDBFFLBi-II), or the like can be used.

[Electron-Transport Material]

For example, a metal complex or an organic compound having a π-electron deficient heteroaromatic ring skeleton can be used as the electron-transport material.

As a metal complex, bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus are preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II) can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4- yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As a heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As the heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used as the host material. An organic compound having an anthracene skeleton is particularly preferable in the case where a fluorescent substance is used as a light-emitting substance. Thus, a light-emitting device with high emission efficiency and high durability can be obtained.

Among the organic compounds having an anthracene skeleton, an organic compound having a diphenylanthracene skeleton, in particular, a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the highest occupied molecular orbital (HOMO) level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

Examples of the substances that can be used include 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-βNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 3-[4-(1-naphthyl)-phenyl]-9-phenyl-9H-carbazole (abbreviation: PCPN), and the like.

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance; therefore, the TADF material and the luminophore of the fluorescent substance can be made away from each other with little influence on carrier-transportation or carrier recombination.

Here, the luminophore refers to an atomic group (skeleton) that causes light emission in a fluorescent substance. The luminophore is preferably a skeleton having a n bond, further preferably includes an aromatic ring, and still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. In particular, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

[Structure Example 1 of Mixed Material]

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Thus, the carrier-transport property of the layer 111 can be easily adjusted and a recombination region can be easily controlled.

[Structure Example 2 of Mixed Material]

In addition, a material mixed with a phosphorescent substance can be used as the host material. When a fluorescent substance is used as the light-emitting substance, a phosphorescent substance can be used as an energy donor for supplying excitation energy to the fluorescent substance.

[Structure Example 3 of Mixed Material]

A mixed material containing a material to form an exciplex can be used as the host material. For example, a material in which an emission spectrum of a formed exciplex overlaps with a wavelength of the absorption band on the lowest energy side of the light-emitting substance can be used as the host material. This enables smooth energy transfer and improves emission efficiency. An increase in the driving voltage can be inhibited. With such a structure, light emission can be efficiently obtained by exciplex-triplet energy transfer (ExTET), which is energy transfer from the exciplex to the light-emitting substance (phosphorescent material).

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The lowest unoccupied molecular orbital (LUMO) level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to the longer wavelength side than the emission spectra of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient PL lifetime of the mixed film has longer lifetime components or a larger proportion of delayed components than that of each of the materials, observed by comparison of transient photoluminescence (PL) of the hole-transport material, the electron-transport material, and the mixed film of the materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

<<Structure Example 1 of Layer 113>>

The layer 113 is located between the electrode 552X and the layer 111 (see FIG. 1A).

An electron-transport material, a material having an anthracene skeleton, and a mixed material can be used for the layer 113, for example. The layer 113 can be referred to as an electron-transport layer. A material having a wider bandgap than the light-emitting material contained in the layer 111 is preferably used for the layer 113. In that case, energy transfer from excitons generated in the layer 111 to the layer 113 can be inhibited.

[Electron-Transport Material]

For example, a metal complex or an organic compound having a π-electron deficient heteroaromatic ring skeleton can be used as the electron-transport material. For example, an electron-transport material capable of being used for the layer 111 can be used for the layer 113. Specifically, an electron-transport material capable of being used as a host material can be used for the layer 113.

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the electron-transport property in the electron-transport layer can be suppressed. The amount of electrons injected into the light-emitting layer can be controlled. The light-emitting layer can be prevented from having excess electrons.

[Material Having Anthracene Skeleton]

An organic compound having an anthracene skeleton can be used for the layer 113. In particular, an organic compound having both an anthracene skeleton and a heterocyclic skeleton can preferably be used.

For example, an organic compound having both an anthracene skeleton and a nitrogen-containing five-membered ring skeleton can be used. Alternatively, an organic compound having both an anthracene skeleton and a nitrogen-containing five-membered ring skeleton where two heteroatoms are included in a ring can be used. Specifically, it is preferable to use, as the heterocyclic skeleton, a pyrazole ring, an imidazole ring, an oxazole ring, a thiazole ring, or the like.

For example, an organic compound having both an anthracene skeleton and a nitrogen-containing six-membered ring skeleton can be used. Alternatively, an organic compound having both an anthracene skeleton and a nitrogen-containing six-membered ring skeleton where two heteroatoms are included in a ring can be used. Specifically, it is preferable to use, as the heterocyclic skeleton, a pyrazine ring, a pyrimidine ring, a pyridazine ring, or the like.

[Structure Example of Mixed Material]

A material in which a plurality of kinds of substances are mixed can be used for the layer 113. Specifically, a mixed material which contains an alkali metal, an alkali metal compound, or an alkali metal complex and an electron-transport substance can be used for the layer 113. Note that the electron-transport material preferably has a HOMO level of −6.0 eV or higher.

Note that for example, a composite material of an acceptor substance and a hole-transport material can be used for the layer 104. Specifically, a composite material of an acceptor substance and a substance having a relatively deep HOMO level HM1, which is greater than or equal to −5.7 eV and lower than or equal to −5.4 eV, can be used for the layer 104. The mixed material can be suitably used for the layer 113 in combination with a structure using such a composite material for a layer 104. This leads to an increase in the reliability of the light-emitting device.

Furthermore, a structure using a hole-transport material for the layer 112 can be suitably combined with the structure using the mixed material for the layer 113 and the composite material for the layer 104. For example, a substance having a HOMO level HM2, which is differs by −0.2 eV to 0 eV from the relatively deep HOMO level HM1, can be used for the layer 112. This leads to an increase in the reliability of the light-emitting device. Note that in this specification and the like, the structure of the above-described light-emitting device may be referred to as a Recombination-Site Tailoring Injection structure (ReSTI structure).

The concentration of the alkali metal, the alkali metal compound, or the alkali metal complex preferably changes in the thickness direction of the layer 113 (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

<<Structure Example 2 of Layer 113>>

The layer 113 contains the organic compound HRM.

Accordingly, the layer 113 can have improved heat resistance. In addition, electrons can be easily transferred in the layer 113. As a result, a novel light-emitting device that is highly convenient, useful, or reliable can be provided.

<<Structure Example of Layer 112>>

The layer 112 is located between the layer 111 and the electrode 551X (see FIG. 1A).

A hole-transport material can be used for the layer 112, for example. The layer 112 can be referred to as a hole-transport layer. A material having a wider bandgap than the light-emitting material contained in the layer 111 is preferably used for the layer 112. In that case, transfer of energy from excitons generated in the layer 111 to the layer 112 can be inhibited.

[Hole-Transport Material]

A material having a hole mobility of $1\times10^{-6}$ $cm^2/Vs$ or higher can be suitably used as the hole-transport material.

For example, a hole-transport material capable of being used for the layer 111 can be used for the layer 112. Specifically, a hole-transport material capable of being used for a host material can be used for the layer 112.

[Structure Example 3 of Organic Compound HRM]

In particular, the organic compound HRM preferably has a molecular weight MW of greater than or equal to 550 and less than or equal to 850.

Accordingly, the unit 103 can have improved heat resistance. In addition, a film containing the organic compound HRM can be formed by an evaporation method. As a result, a novel light-emitting device that is highly convenient, useful, or reliable can be provided.

Note that this embodiment can be combined with any of the other embodiments in this specification as appropriate.

Embodiment 2

In this embodiment, a structure of the light-emitting device 550 of one embodiment of the present invention is described with reference to FIG. 1A.

<Structure Example of Light-Emitting Device 550>

The light-emitting device 550 described in this embodiment includes the electrode 551X, the electrode 552X, the unit 103, and the layer 104. The electrode 552X includes a region overlapping with the electrode 551X, and the unit 103 includes a region between the electrode 551X and the electrode 552X. The layer 104 includes a region between the electrode 551X and the unit 103. For example, the structure described in Embodiment 1 can be employed for the unit 103.

<Structure Example of Electrode 551X>

For example, a conductive material can be used for the electrode 551X. Specifically, a single layer or a stack using a metal, an alloy, or a film containing a conductive compound can be used for the electrode 551X.

A film that efficiently reflects light can be used for the electrode 551X, for example. Specifically, an alloy containing silver, copper, and the like, an alloy containing silver, palladium, and the like, or a metal film of aluminum or the like can be used for the electrode 551X.

For example, a metal film that transmits part of light and reflects another part of light can be used for the electrode 551X. Thus, a microcavity structure can be provided in the light-emitting device 550. Alternatively, light with a predetermined wavelength can be extracted more efficiently than light with the other wavelengths. Alternatively, light with a narrow spectral half-width can be extracted. Alternatively, light of a bright color can be extracted.

A film having a visible-light-transmitting property can be used for the electrode 551X, for example. Specifically, a single layer or a stack using a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

<<Structure Example of Layer 104>>

A hole-injection material can be used for the layer 104, for example. The layer 104 can be referred to as a hole-injection layer.

Specifically, an acceptor substance can be used for the layer 104. Alternatively, a composite material containing a plurality of kinds of substances can be used for the layer 104. This can facilitate the injection of holes from the electrode 551X, for example. Alternatively, the driving voltage of the light-emitting device can be reduced.

[Acceptor Substance]

An organic compound or an inorganic compound can be used as the acceptor substance. The acceptor substance can extract electrons from an adjacent hole-transport layer or a hole-transport material by the application of an electric field.

For example, a compound having an electron-withdrawing group (a halogen or cyano group) can be used as the acceptor substance. Note that an organic compound having an acceptor property is easily evaporated, which facilitates film deposition. Thus, the productivity of the light-emitting device can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the acceptor substance, a molybdenum oxide, a vanadium oxide, a ruthenium oxide, a tungsten oxide, a manganese oxide, or the like can be used.

It is possible to use any of the following materials: phthalocyanine-based complex compounds such as phthalocyanine (abbreviation: $H_2Pc$) and copper phthalocyanine (abbreviation: CuPc); and compounds each having an aromatic amine skeleton such as 4,4'-bis[N-(4-diphenylaminophenyl)-N-phenylamino]biphenyl (abbreviation: DPAB) and N,N'-bis {4-[bis(3-methylphenyl)amino]phenyl}-N,N'-diphenyl-(1,1'-biphenyl)-4,4'-diamine (abbreviation: DNTPD).

In addition, high molecular compounds such as poly(3,4-ethylenedioxythiophene)/poly(styrenesulfonic acid) (abbreviation: PEDOT/PSS), and the like can be used.

[Structure Example 1 of Composite Material]

For example, a composite material containing an acceptor substance and a hole-transport material can be used for the layer 104. Accordingly, not only a material having a high work function but also a material having a low work function can also be used for the electrode 551X. Alternatively, a material used for the electrode 551X can be selected from a wide range of materials regardless of its work function.

For the hole-transport material in the composite material, for example, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ $cm^2/Vs$ or higher can be suitably used as the hole-transport material in the composite material.

A substance having a relatively deep HOMO level can be suitably used for the hole-transport material in the composite material. Specifically, the HOMO level is preferably higher than or equal to −5.7 eV and lower than or equal to −5.4 eV. Accordingly, hole injection to the unit 103 can be facilitated. Hole injection to the layer 112 can be facilitated. The reliability of the light-emitting device can be increased.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis(3-methylphenyl)amino]phenyl}-N,N'-diphenyl-(1,1'-biphenyl)-4,4'-diamine (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As aromatic hydrocarbon having a vinyl skeleton, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

Furthermore, a substance having any of a carbazole skeleton, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With use of a substance including an N,N-bis(4-biphenyl)amino group, the reliability of the light-emitting device can be increased.

Specific examples of the hole-transport material in the composite material include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6- phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N'-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6; 1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

[Structure Example 2 of Composite Material]

For example, a composite material including an acceptor substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104 can be reduced. A layer with a low refractive index can be formed inside the light-emitting device. The external quantum efficiency of the light-emitting device can be improved.

Note that this embodiment can be combined with any of the other embodiments in this specification as appropriate.

Embodiment 3

In this embodiment, a structure of the light-emitting device 550 of one embodiment of the present invention is described with reference to FIG. 1A.

<Structure Example of Light-Emitting Device 550>

The light-emitting device 550 described in this embodiment includes the electrode 551X, the electrode 552X, the unit 103, and a layer 105. The electrode 552X includes a region overlapping with the electrode 551X, and the unit 103 includes a region between the electrode 551X and the electrode 552X. The layer 105 includes a region between the unit 103 and the electrode 552X. For example, the structure described in Embodiment 1 can be employed for the unit 103.

<Structure Example of Electrode 552X>

For example, a conductive material can be used for the electrode 552X. Specifically, a single layer or a stack using a metal, an alloy, or a film containing a conductive compound can be used for the electrode 552X.

For example, the material that can be used for the electrode 551X described in Embodiment 2 can be used for the electrode 552X. In particular, a material with a lower work function than the electrode 551X can be suitably used for the electrode 552X. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 552X.

Specifically, an element such as lithium (Li) or cesium (Cs), an element such as magnesium (Mg), calcium (Ca), or strontium (Sr), an element such as europium (Eu) or ytterbium (Yb), or an alloy containing any of these elements such as MgAg or AlLi can be used for the electrode 552X.

<<Structure Example of Layer 105>>

An electron-injection material can be used for the layer 105, for example. The layer 105 can be referred to as an electron-injection layer.

Specifically, a donor substance can be used for the layer 105. Alternatively, a material in which a donor substance and an electron-transport material are combined can be used for the layer 105. Alternatively, electride can be used for the layer 105. This can facilitate the injection of electrons from the electrode 552X, for example. Alternatively, not only a material having a low work function but also a material having a high work function can also be used for the electrode 552X. Alternatively, a material used for the electrode 552X can be selected from a wide range of materials regardless of its work function. Specifically, Al, Ag, ITO, indium oxide-tin oxide containing silicon or silicon oxide, or the like can be used for the electrode 552X. The driving voltage of the light-emitting device can be reduced.

[Donor Substance]

For example, an alkali metal, an alkaline earth metal, a rare earth metal, or a compound thereof (an oxide, a halide, a carbonate, or the like) can be used for the donor substance. Alternatively, an organic compound such as tetrathianaphthacene (abbreviation: TTN), nickelocene, or decamethylnickelocene can be used as the donor substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

[Structure Example 1 of Composite Material]

A material composed of two or more kinds of substances can be used as the electron-injection material. For example, a donor substance and an electron-transport material can be used for the composite material.

[Electron-Transport Material]

For example, a metal complex or an organic compound having a π-electron deficient heteroaromatic ring skeleton can be used as the electron-transport material.

For example, an electron-transport material capable of being used for the unit 103 can be used as the composite material.

[Structure Example 2 of Composite Material]

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or an alkaline earth metal at 50 wt % or higher can be suitably used. Alternatively, a composite material including an organic compound having a bipyridine skeleton can be suitably used. Thus, the refractive index of the layer 105 can be reduced. The external quantum efficiency of the light-emitting device can be improved.

[Structure Example 3 of Composite Material]

For example, a composite material of a first organic compound including an unshared electron pair and a first metal can be used for the layer 105. The sum of the number of electrons of the first organic compound and the number of electrons of the first metal is preferably an odd number. The molar ratio of the first metal to 1 mol of the first organic compound is preferably greater than or equal to 0.1 and less than or equal to 10, more preferably greater than or equal to 0.2 and less than or equal to 2, further more preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 552X into the layer 105, a barrier therebetween can be reduced. The first metal has a low reactivity with water or oxygen; thus, the moisture resistance of the light-emitting device can be improved.

The layer 105 can adopt a composite material that allows the spin density measured by an electron spin resonance (ESR) method to be preferably greater than or equal to $1\times10^{16}$ spins/$cm^3$, more preferably greater than or equal to $5\times10^{16}$ spins/$cm^3$, further more preferably greater than or equal to $1\times10^{17}$ spins/$cm^3$.

[Organic Compound Including Unshared Electron Pair]

For example, an electron-transport material can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device can be reduced.

Note that the LUMO level of the organic compound having an unshared electron pair is preferably higher than or equal to −3.6 eV and lower than or equal to −2.3 eV. In general, the HOMO level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair.

Alternatively, for example, copper phthalocyanine can be used for the organic compound including an unshared electron pair. The number of electrons of the copper phthalocyanine is an odd number.

[First Metal]

When the number of electrons of the first organic compound including an unshared electron pair is an even number, for example, a composite material of the first metal and the first organic compound, which belongs to an odd-numbered group in the periodic table, can be used for the layer 105.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 552X and the layer 105 can increase the adhesion between the layer 105 and the electrode 552X.

When the number of electrons of the first organic compound including an unshared electron pair is an odd number, a composite material of the first metal and the first organic compound, which belongs to an even-numbered group in the periodic table, can be used for the layer 105. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed can be used, for example, as the electron-injection material.

Note that this embodiment can be combined with any of the other embodiments in this specification as appropriate.

Embodiment 4

In this embodiment, a structure of the light-emitting device 550 of one embodiment of the present invention is described with reference to FIG. 2A.

Figure 2A:
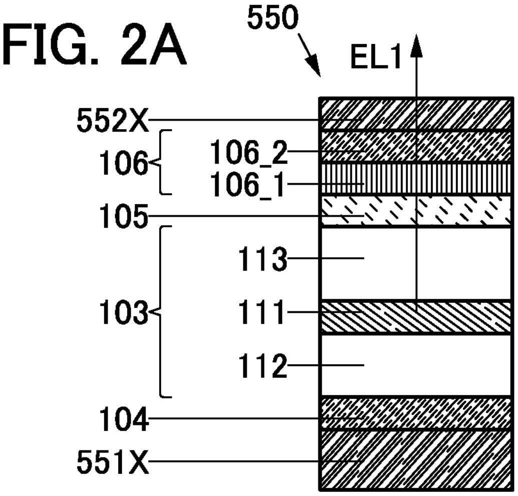
FIGS. 2A and 2B illustrate structures of light-emitting devices of embodiments.

FIG. 2A is a cross-sectional view illustrating a structure of a light-emitting device of one embodiment of the present invention.

<Structure Example of Light-Emitting Device 550>

The light-emitting device 550 described in this embodiment includes the electrode 551X, the electrode 552X, the unit 103, and an intermediate layer 106 (see FIG. 2A). The electrode 552X includes a region overlapping with the electrode 551X, and the unit 103 includes a region between the electrode 551X and the electrode 552X. The intermediate layer 106 includes a region between the unit 103 and the electrode 552X.

<<Structure Example of Intermediate Layer 106>>

The intermediate layer 106 includes a layer 106_1 and a layer 106_2. The layer 106_2 includes a region between the layer 106_1 and the electrode 552X.

<<Structure Example of Layer 106_1>>

For example, an electron-transport material can be used for the layer 106_1. The layer 106_1 can be referred to as an electron-relay layer. With the layer 106_1, a layer that is on the anode side and in contact with the layer 106_1 can be distanced from a layer that is on the cathode side and in contact with the layer 106_1. Interaction between the layer that is on the anode side and in contact with the layer 106_1 and the layer that is on the cathode side and in contact with the layer 106_1 can be reduced. Electrons can be smoothly supplied to the layer that is on the anode side and in contact with the layer 106_1.

A substance whose LUMO level is positioned between the LUMO level of the acceptor substance contained in the layer that is on the anode side and in contact with the layer 106_1 and the LUMO level of the substance contained in the layer that is on the cathode side and in contact with the layer 106_1 can be suitably used for the layer 106_1.

For example, a material having a LUMO level in a range higher than or equal to −5.0 eV, preferably higher than or equal to −5.0 eV and lower than or equal to −3.0 eV, can be used for the layer 106_1.

Specifically, a phthalocyanine-based material can be used for the layer 106_1. In addition, a metal complex having a metal-oxygen bond and an aromatic ligand can be used for the layer 106_1.

<<Structure Example of Layer 106_2>>

For example, a material that supplies electrons to the anode side and supplies holes to the cathode side when voltage is applied can be used for the layer 106_2. Specifically, electrons can be supplied to the unit 103 that is positioned on the anode side. The layer 106_2 can be referred to as a charge-generation layer.

Specifically, a hole-injection material capable of being used for the layer 104 described in Embodiment 2 can be used for the layer 106_2. For example, a composite material can be used for the layer 106_2. Alternatively, for example, a stacked film in which a film including the composite material and a film including a hole-transport material are stacked can be used for the layer 106_2.

Note that this embodiment can be combined with any of the other embodiments in this specification as appropriate.

Embodiment 5

In this embodiment, a structure of the light-emitting device 550 of one embodiment of the present invention is described with reference to FIG. 2B.

Figure 2B:
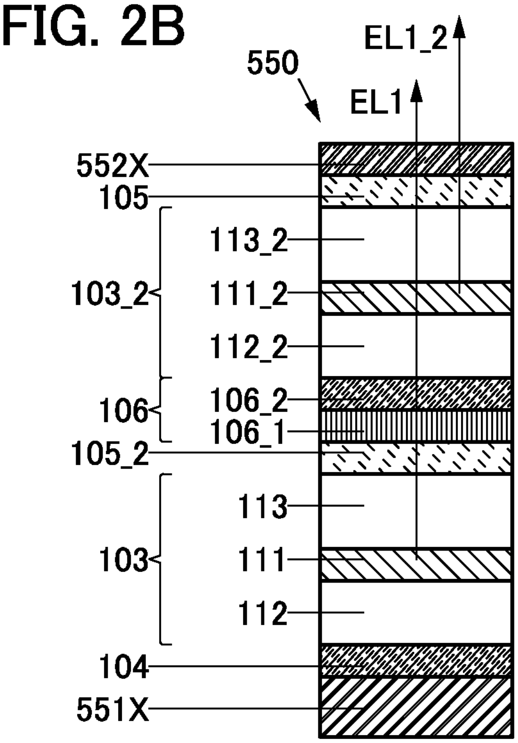

FIG. 2B is a cross-sectional view illustrating a structure of a light-emitting device of one embodiment of the present invention, which is different from that in FIG. 2A.

<Structure Example of Light-Emitting Device 550>

The light-emitting device 550 described in this embodiment includes the electrode 551X, the electrode 552X, the unit 103, the intermediate layer 106, and a unit 103_2 (see FIG. 2B). The electrode 552X includes the region overlapping with the electrode 551X, the unit 103 includes the region between the electrode 551X and the electrode 552X, and the intermediate layer 106 includes the region between the unit 103 and the electrode 552X. The unit 103_2 includes a region between the intermediate layer 106 and the electrode 552X, and the unit 103_2 has a function of emitting light EL1_2. The light-emitting device 550 also includes a layer 105_2 including a region between the unit 103 and the intermediate layer 106.

In other words, the light-emitting device 550 includes the stacked units between the electrode 551X and the electrode 552X. The number of stacked units is not limited to two and may be three or more. A structure including the stacked units located between the electrode 551X and the electrode 552X and the intermediate layer 106 located between the units is referred to as a stacked light-emitting device or a tandem light-emitting device in some cases. This structure enables high luminance emission while the current density is kept low. Reliability can be improved. The driving voltage can be reduced in comparison with that of the light-emitting device with the same luminance. The power consumption can be reduced.

<<Structure Example 1 of Unit 103_2>>

The unit 103_2 includes a layer 111_2, a layer 112_2, and a layer 113_2. The structure that can be employed for the unit 103 can be employed for the unit 103_2. For example, the same structure as the unit 103 can be employed for the unit 103_2.

<<Structure Example 2 of Unit 103_2>>

Alternatively, a structure different from the unit 103 can be employed for the unit 103_2. For example, a structure which exhibits a different emission color from that of the unit 103 can be employed for the unit 103_2. Specifically, the unit 103 emitting red light and green light and the unit 103_2 emitting blue light can be employed. With this structure, a light-emitting device emitting light of a desired color can be provided. A light-emitting device emitting white light can be provided, for example.

<<Structure Example of Intermediate Layer 106>>

The intermediate layer 106 has a function of supplying electrons to one of the unit 103 and the unit 103_2 and supplying holes to the other. For example, the intermediate layer 106 described in Embodiment 4 can be used.

<<Structure Example of Layer 105_2>>

For example, an electron-injection material can be used for the layer 105_2. The layer 105_2 can also be referred to as an electron-injection layer. For example, the material that can be used for the layer 105 described in Embodiment 3 can be used for the layer 105_2.

<Fabrication Method of Light-Emitting Device 550>

For example, each of the electrode 551X, the electrode 552X, the unit 103, the intermediate layer 106, and the unit 103_2 can be formed by a dry process, a wet process, an evaporation method, a droplet discharging method, a coating method, a printing method, or the like. A formation method may differ between components of the device.

Specifically, the light-emitting device 550 can be manufactured with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. In addition, an indium oxide-zinc oxide film can be formed by a sputtering method using a target obtained by adding indium zinc to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 6

In this embodiment, structures of a photoelectric conversion device of one embodiment of the present invention are described with reference to FIGS. 3A and 3B.

Figure 3A:
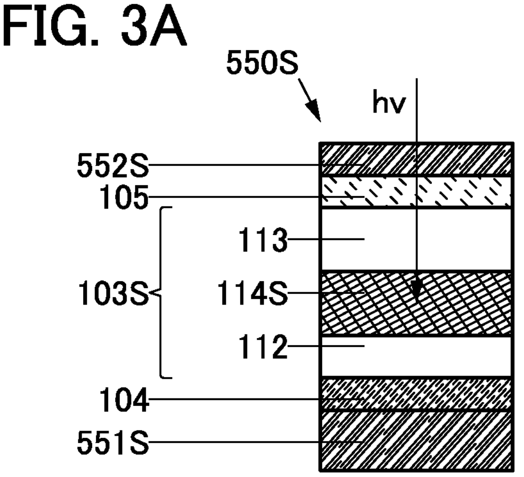
FIGS. 3A and 3B illustrate structures of photoelectric conversion devices of embodiments.
Figure 3B:
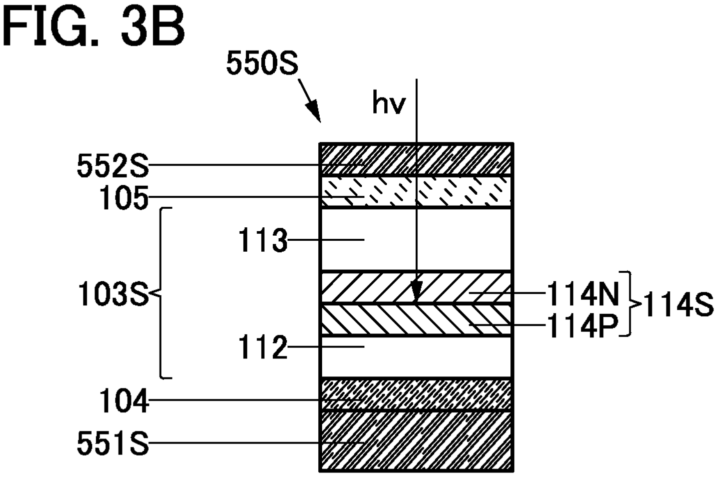

FIGS. 3A and 3B are cross-sectional views each illustrating the structure of a photoelectric conversion device 550S of one embodiment of the present invention.

<Structure Example of Photoelectric Conversion Device>

The photoelectric conversion device 550S described in this embodiment includes an electrode 551S, an electrode 552S, and a unit 103S (see FIGS. 3A and 3B). The unit 103S is located between the electrode 551S and the electrode 552S.

<Structure Example 1 of Unit 103S>

The unit 103S has a single-layer structure or a stacked-layer structure and has a photoelectric conversion function.

The unit 103S can include, for example, a layer selected from functional layers such as a photoelectric conversion layer, a hole-transport layer, and an electron-transport layer. A layer selected from functional layers such as a hole-injection layer, an electron-injection layer, and an exciton-blocking layer can also be used for the unit 103S.

The unit 103S contains an electron-donating material DM and an electron-accepting material AM. The unit 103S also contains an organic compound HRM.

[Structure Example 1 of Organic Compound HRM]

The organic compound HRM has four or more rotatable bonds RB. The organic compound HRM has a principal moment of inertia PMI.

For example, the organic compound HRM described in Embodiment 1 can be used for the unit 103S.

Therefore, the organic compound HRM with a shape close to a linear shape between the linear shape and a circular shape can be used for the unit 103S. Accordingly, the unit 103S can have improved heat resistance. As a result, a novel photoelectric conversion device that is highly convenient, useful, or reliable can be provided.

[Structure Example 2 of Organic Compound HRM]

The organic compound HRM has a polar surface area PSA of 30 $Å^2$ or larger. For example, the organic compound HRM described in Embodiment 1 can be used for the unit 103S.

Accordingly, the unit 103S can have improved heat resistance. In addition, electrons can be easily transferred in the unit 103S. As a result, a novel photoelectric conversion device that is highly convenient, useful, or reliable can be provided.

<Structure Example 2 of Unit 103S>

The unit 103S includes a layer 114S, the layer 112, and the layer 113. The layer 114S is located between the layer 112 and the layer 113 and contains the electron-accepting material AM and the electron-donating material DM (see FIG. 3A).

<<Structure Example 1 of Layer 114S>>

For example, an electron-accepting material and an electron-donating material can be used for the layer 114S. Specifically, a material that can be used for an organic solar cell can be used for the layer 114S. In addition, the layer 114S can be referred to as a photoelectric conversion layer. The layer 114S absorbs light hv, supplies electrons to one electrode, and supplies holes to the other. For example, the layer 114S supplies holes to the electrode 551S and supplies electrons to the electrode 552S. In other words, the photoelectric conversion device 550S can be used as a photoelectric conversion device.

[Example of Electron-Accepting Material]

As the electron-accepting material, a fullerene derivative or a non-fullerene electron acceptor can be used, for example.

As the electron-accepting material, a $C_{60}$ fullerene, a $C_{70}$ fullerene, [6,6]-phenyl-$C_{71}$-butyric acid methyl ester (abbreviation: PC71BM), [6,6]-phenyl-$C_{61}$-butyric acid methyl ester (abbreviation: PC61BM), 1',1",4',4"-tetrahydro-di[1,4]methanonaphthaleno[1,2:2',3',56,60:2",3"][5,6]fullerene-$C_{60}$ (abbreviation: ICBA), or the like can be used.

As the non-fullerene electron acceptor, a perylene derivative, a compound having a dicyanomethyleneindanone group, or the like can be used. For example, N,N'-dimethyl-3,4,9,10-perylenetetracarboxylic diimide (abbreviation: Me-PTCDI) can be used.

[Example of Electron-Donating Material]

As the electron-donating material, a phthalocyanine compound, a tetracene derivative, a quinacridone derivative, or a rubrene derivative can be used, for example.

As the electron-donating material, copper(II) phthalocyanine (abbreviation: CuPc), tin(II) phthalocyanine (SnPc), zinc phthalocyanine (ZnPc), tetraphenyldibenzoperiflanthene (DBP), rubrene, or the like can be used.

<<Structure Example 2 of Layer 114S>>

The layer 114S can have a single-layer structure or a stacked-layer structure, for example. Specifically, the layer 114S can have a bulk heterojunction structure. Alternatively, the layer 114S can have a heterojunction structure.

[Structure Example of Mixed Material]

A mixed material containing an electron-accepting material and an electron-donating material can be used for the layer 114S, for example (see FIG. 3A). Note that a structure in which such a mixed material containing an electron-accepting material and an electron-donating material is used for the layer 114S can be referred to as a bulk heterojunction structure.

Specifically, a mixed material containing a $C_{70}$ fullerene and DBP can be used for the layer 114S.

[Example of Heterojunction Structure]

A layer 114N and a layer 114P can be used for the layer 114S. The layer 114N includes a region between one electrode and the layer 114P, and the layer 114P includes a region between the layer 114N and the other electrode. For example, the layer 114N includes a region between the electrode 552S and the layer 114P, and the layer 114P includes a region between the layer 114N and the electrode 551S (see FIG. 3B).

An n-type semiconductor can be used for the layer 114N. For example, Me-PTCDI can be used for the layer 114N.

A p-type semiconductor can be used for the layer 114P. For example, rubrene can be used for the layer 114P.

Note that the photoelectric conversion device 550S in which the layer 114P is in contact with the layer 114N can be referred to as a pn-junction photodiode.

<<Structure Example 1 of Layer 113>>

The layer 113 is located between the electrode 552S and the layer 114S (see FIGS. 3A and 3B).

An electron-transport material, a material having an anthracene skeleton, and a mixed material can be used for the layer 113, for example. The layer 113 can be referred to as an electron-transport layer. Note that a material that can be used for the layer 113 described in Embodiment 1 can be used for the layer 113.

<<Structure Example 2 of Layer 113>>

The layer 113 contains the organic compound HRM. For example, the organic compound HRM described in Embodiment 1 can be used for the layer 113.

Accordingly, the layer 113 can have improved heat resistance. In addition, electrons can be easily transferred in the layer 113. Light can be converted into a current. As a result, a novel photoelectric conversion device that is highly convenient, useful, or reliable can be provided.

<<Structure Example of Layer 112>>

The layer 112 is located between the layer 114S and the electrode 551S (see FIGS. 3A and 3B).

A hole-transport material can be used for the layer 112, for example. The layer 112 can be referred to as a hole-transport layer. Note that a material that can be used for the layer 112 described in Embodiment 1 can be used for the layer 112.

[Structure Example 3 of Organic Compound HRM]

In particular, the organic compound HRM preferably has a molecular weight MW of greater than or equal to 550 and less than or equal to 850.

Accordingly, the unit 103S can have improved heat resistance. In addition, a film containing the organic compound HRM can be formed by an evaporation method. As a result, a novel photoelectric conversion device that is highly convenient, useful, or reliable can be provided.

Note that this embodiment can be combined with any of the other embodiments in this specification as appropriate.

Embodiment 7

In this embodiment, structures of a display device of one embodiment of the present invention are described with reference to FIGS. 4A and 4B.

Figure 4A:
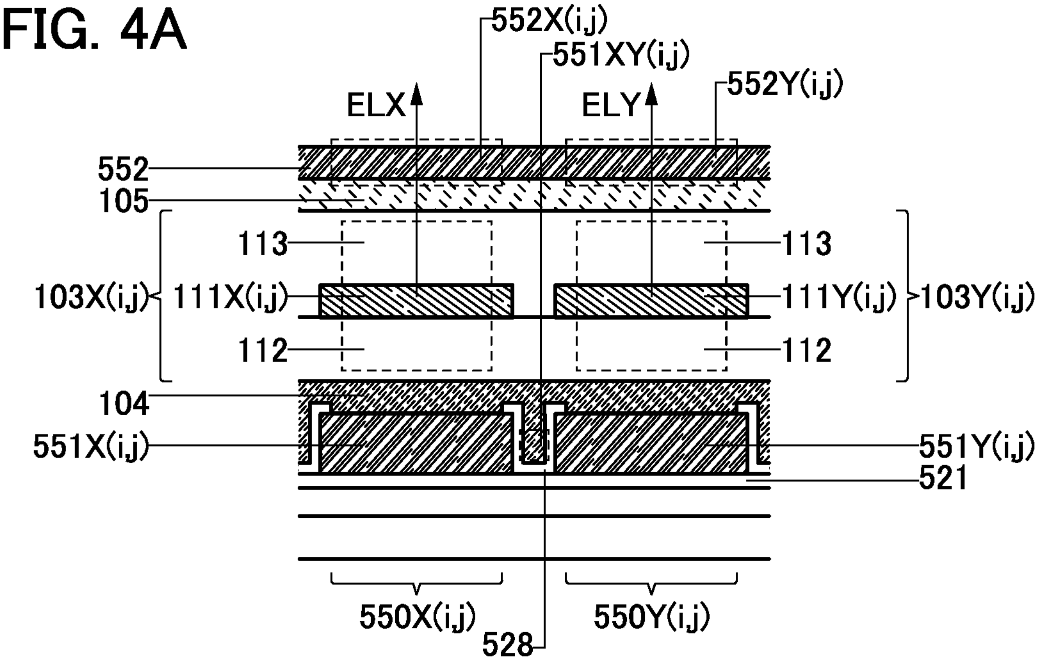
FIGS. 4A and 4B are cross-sectional views illustrating display devices of embodiments.
Figure 4B:
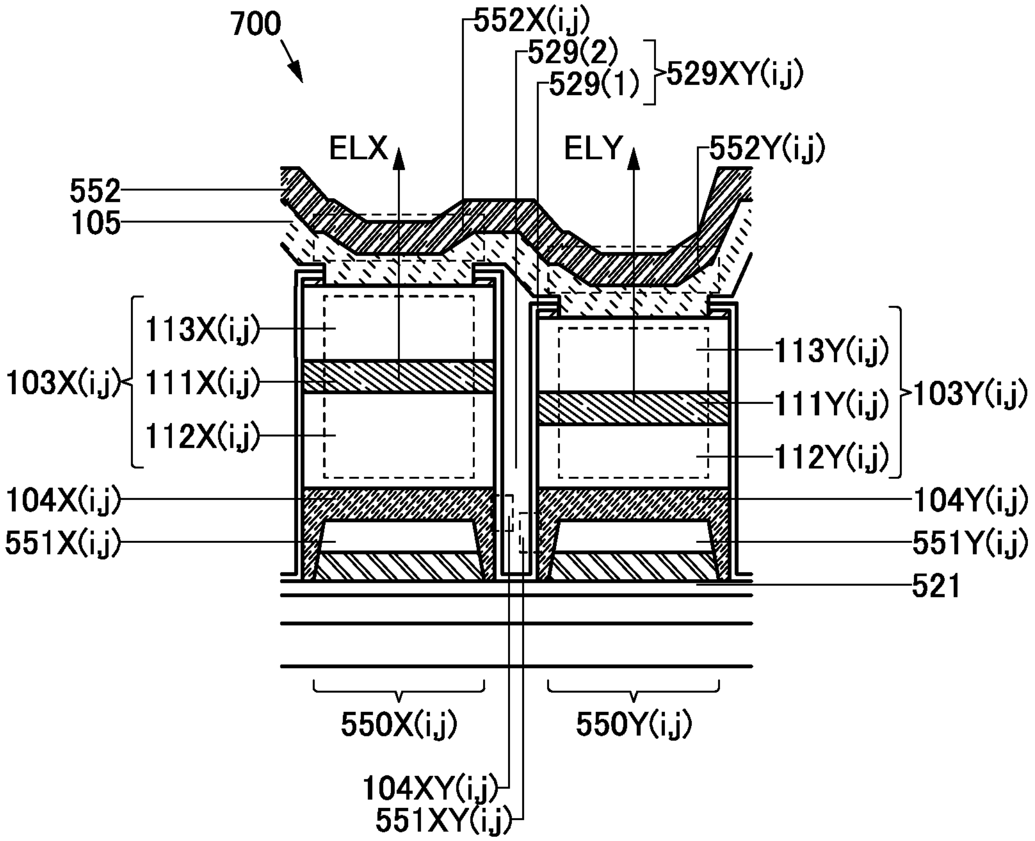

FIG. 4A is a cross-sectional view illustrating a structure of the display device of one embodiment of the present invention, and FIG. 4B is a cross-sectional view illustrating a structure of the display device, which is different from the structure in FIG. 4A.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

<Structure Example 1 of Display Device>

A display device 700 described in this embodiment includes a light-emitting device 550X(i,j), a light-emitting device 550Y(i,j), an insulating film 521, and a conductive film 552 (see FIG. 4A). Note that the light-emitting device 550Y(i,j) is adjacent to the light-emitting device 550X(i,j). The display device 700 includes an insulating film 528.

<<Structure Example 1 of Light-Emitting Device 550X(i,j)>>

The light-emitting device 550X(i,j) includes an electrode 551X(i,j), an electrode 552X(i,j), and a unit 103X(i,j). The unit 103X(i,j) is located between the electrode 552X(i,j) and the electrode 551X(i,j).

For example, the light-emitting device described in any one of Embodiments 1 to 5 can be used as the light-emitting device 550X(i,j). Specifically, the structure that can be employed for the electrode 551X can be employed for the electrode 551X(i,j). In addition, the structure that can be employed for the unit 103 can be employed for the unit 103X(i,j).

The unit 103X(i,j) includes a layer 111X(i,j), the layer 112, and the layer 113 (see FIG. 4A). For example, the structure that can be employed for the layer 111 can be employed for the layer 111X(i,j). The layer 111X(i,j) has a function of emitting light ELX.

<<Structure Example 1 of Light-Emitting Device 550Y(i,j)>>

The light-emitting device 550Y(i,j) includes an electrode 551Y(i,j), an electrode 552Y(i,j), and a unit 103Y(i,j). The unit 103Y(i,j) is located between the electrode 552Y(i,j) and the electrode 551Y(i,j).

For example, a material that can be used for the electrode 551X(i,j) can be used for the electrode 551Y(i,j). A potential supplied to the electrode 551Y(i,j) may be the same as or different from a potential supplied to the electrode 551X(i,j). By supplying a different potential, the light-emitting device 550Y(i,j) can be driven under conditions different from those for the light-emitting device 550X(i,j).

<<Structure Example 1 of Unit 103Y(i,j)>>

The unit 103Y(i,j) has a single-layer structure or a stacked-layer structure.

For example, a layer selected from functional layers such as a light-emitting layer, a hole-transport layer, an electron-transport layer, and a carrier-blocking layer can be used for the unit 103Y(i,j). A layer selected from functional layers such as a hole-injection layer, an electron-injection layer, an exciton-blocking layer, and a charge-generation layer can also be used for the unit 103Y(i,j).

<<Structure Example 2 of Unit 103Y(i,j)>>

The unit 103Y(i,j) includes a layer 111Y(i,j), the layer 112, and the layer 113, for example (see FIG. 4A). The layer 111Y(i,j) has a function of emitting light ELY. Light with a hue that is the same as or different from the hue of the light ELX can be used as the light ELY.

The layer 112 includes a region between the electrode 551Y(i,j) and the layer 111Y(i,j), the layer 111Y(i,j) includes a region between the layer 112 and the layer 113, and the layer 113 includes a region between the layer 111Y(i,j) and the electrode 552Y(i,j).

<<Structure Example 2 of Light-Emitting Device 550Y(i,j)>>

The light-emitting device 550Y(i,j) includes the layer 104 and the layer 105. The layer 104 includes a region between the electrode 551Y(i,j) and the unit 103Y(i,j), and the layer 105 includes a region between the unit 103X(i,j) and the electrode 552X(i,j).

Note that a component of the light-emitting device 550X(i,j) can be used as a component of the light-emitting device 550Y(i,j). Thus, the component can be used in common. In addition, the manufacturing process can be simplified. Moreover, the light-emitting device 550X(i,j) and the light-emitting device 550Y(i,j) can include the same component. Furthermore, for example, a material that can be used for the light-emitting device 550 described in any one of Embodiments 1 to 5 can be used for the light-emitting device 550Y(i,j).

<<Structure Example 1 of Conductive Film 552>>

The conductive film 552 electrically connects the electrode 552X(i,j) to the electrode 552Y(i,j) (see FIG. 4A). Note that in one conductive film, a region overlapping with the electrode 551X(i,j) can be used as the electrode 552X (i,j), a region overlapping with the electrode 551Y(i,j) can be used as the electrode 552Y(i,j), and a region between the two regions can be used as the conductive film 552.

<<Structure Example of Insulating Film 521>>

The electrode 551X(i,j) is located between the unit 103X (i,j) and the insulating film 521.

The electrode 551Y(i,j) is located between the unit 103Y (i,j) and the insulating film 521, and a space 551XY(i,j) is provided between the electrode 551X(i,j) and the electrode 551Y(i,j).

The space 551XY(i,j) is located between the conductive film 552 and the insulating film 521.

For example, an insulating inorganic material, an insulating organic material, or an insulating composite material including an inorganic material and an organic material can be used for the insulating film 521.

Specifically, an inorganic oxide film, an inorganic nitride film, an inorganic oxynitride film, and the like, or a layered material obtained by stacking some of these films can be used for the insulating film 521.

For example, a film including any of a silicon oxide film, a silicon nitride film, a silicon oxynitride film, an aluminum oxide film, and the like, or a film including a material obtained by stacking any of these films can be used for the insulating film 521. Note that a silicon nitride film is a dense film and has an excellent function of inhibiting diffusion of impurities.

For example, polyester, polyolefin, polyamide, polyimide, polycarbonate, polysiloxane, or an acrylic resin, or a layered or composite material including resins selected from these can be used for the insulating film 521. Note that polyimide is excellent in the following properties, for example, compared with other organic materials: thermal stability, an insulating property, toughness, a low dielectric constant, a low coefficient of thermal expansion, and high chemical resistance. Accordingly, in particular, polyimide can be suitably used for the insulating film 521 or the like.

Alternatively, the insulating film 521 may be formed using a photosensitive material. Specifically, a film formed using photosensitive polyimide, a photosensitive acrylic resin, or the like can be used as the insulating film 521.

<<Structure Example of Insulating Film 528>>

The insulating film 528 has openings; one opening overlaps with the electrode 551X(i,j) and the other opening overlaps with the electrode 551Y(i,j).

For example, a material that can be used for the insulating film 521 can be used for the insulating film 528. Specifically, a silicon oxide film, a film containing an acrylic resin, a film containing polyimide, or the like can be used as the insulating film 528.

<<Structure Example 2 of Light-Emitting Device 550X(i,j)>>

The light-emitting device 550X(i,j) includes a layer 104X (i,j). The layer 104X(i,j) is located between the unit 103X (i,j) and the electrode 551X(i,j) (see FIG. 4B).

Note that the unit 103X(i,j) includes the layer 111X(i,j), a layer 112X(i,j), and a layer 113X(i,j). The structure that can be employed for the layer 112 can be employed for the layer 112X(i,j), and the structure that can be employed for the layer 113 can be employed for the layer 113X(i,j), for example.

<<Structure Example of Layer 104X(i,j)>>

The layer 104X(i,j) contains an electron-accepting substance AM and a hole-transport material HTM, and the layer 104X(i,j) has an electrical resistivity greater than or equal to $1\times10^2$ [Ω·cm] and less than or equal to $1\times10^8$ [Ω·cm].

<<Structure Example 3 of Light-Emitting Device 550Y(i,j)>>

The light-emitting device 550Y(i,j) includes a layer 104Y (i,j). The layer 104Y(i,j) is located between the unit 103Y (i,j) and the electrode 551Y(i,j), and a space 104XY(i,j) is provided between the layer 104X(i,j) and the layer 104Y(i, j).

Note that the unit 103Y(i,j) includes the layer 111Y(i,j), a layer 112Y(i,j), and a layer 113Y(i,j). The structure that can be employed for the layer 112 can be employed for the layer 112Y(i,j), and the structure that can be employed for the layer 113 can be employed for the layer 113Y(i,j), for example.

<<Structure Example of Layer 104Y(i,j)>>

The layer 104Y(i,j) contains an electron-accepting substance AM and a hole-transport material HTM.

Thus, current flowing between the layer 104X(i,j) and the layer 104Y(i,j) can be suppressed. In addition, occurrence of crosstalk between the light-emitting device 550X(i,j) and the light-emitting device 550Y(i,j) can be suppressed. Furthermore, the light-emitting device 550Y(i,j) can be separated from the light-emitting device 550X(i,j). As a result, a novel display device that is highly convenient, useful, or reliable can be provided.

<<Structure Example 2 of Display Device>>

The display device 700 described in this embodiment includes a filler 529XY(i,j) (see FIG. 4B).

The filler 529XY(i,j) is located between the electrode 551X(i,j) and the electrode 551Y(i,j), between the insulating film 521 and the conductive film 552, and between the unit 103X(i,j) and the unit 103Y(i,j).

<<Structure Example 1 of Filler 529XY(i,j)>>

For example, an insulating inorganic material, an insulating organic material, or an insulating composite material including an inorganic material and an organic material can be used for the filler 529XY(i,j).

Specifically, an inorganic oxide film, an inorganic nitride film, an inorganic oxynitride film, and the like, or a layered material obtained by stacking some of these films can be used for the filler 529XY(i,j).

For example, a film including any of a silicon oxide film, a silicon nitride film, a silicon oxynitride film, an aluminum oxide film, and the like, or a film including a material obtained by stacking any of these films can be used for the filler 529XY(i,j). Note that a silicon nitride film is a dense film and has an excellent function of inhibiting diffusion of impurities.

For example, polyester, polyolefin, polyamide, polyimide, polycarbonate, polysiloxane, or an acrylic resin, or a layered or composite material including resins selected from these can be used for the filler 529XY(i,j).

<<Structure Example 2 of Filler 529XY(i,j)>>

The filler 529XY(i,j) includes a filler 529(1) and a filler 529(2), for example.

For example, an insulating inorganic material can be used for the filler 529(1). Specifically, aluminum oxide or the like can be used for the filler 529(1). For example, a dense film that is formed by a chemical vapor deposition method, an atomic layer deposition (ALD) method, or the like can be used for the filler 529(1).

For example, an insulating organic material can be used for the filler 529(2). Specifically, polyimide or an acrylic resin can be used for the filler 529(2). The filler 529(2) can be formed using a photosensitive material.

Accordingly, the light-emitting device 550Y(i,j) can be separated from the light-emitting device 550X(i,j). A space formed between the light-emitting device 550X(i,j) and the light-emitting device 550Y(i,j) can be filled with the filler 529XY(i,j). A step due to the space formed between the light-emitting device 550X(i,j) and the light-emitting device 550Y(i,j) can be reduced. A step generated in the conductive film 552 can be reduced. A phenomenon in which a cut or a split is generated along the step in the conductive film 552 can be suppressed. As a result, a novel display device that is highly convenient, useful, or reliable can be provided.

<<Structure Example 3 of Display Device>>

Figure 5A:
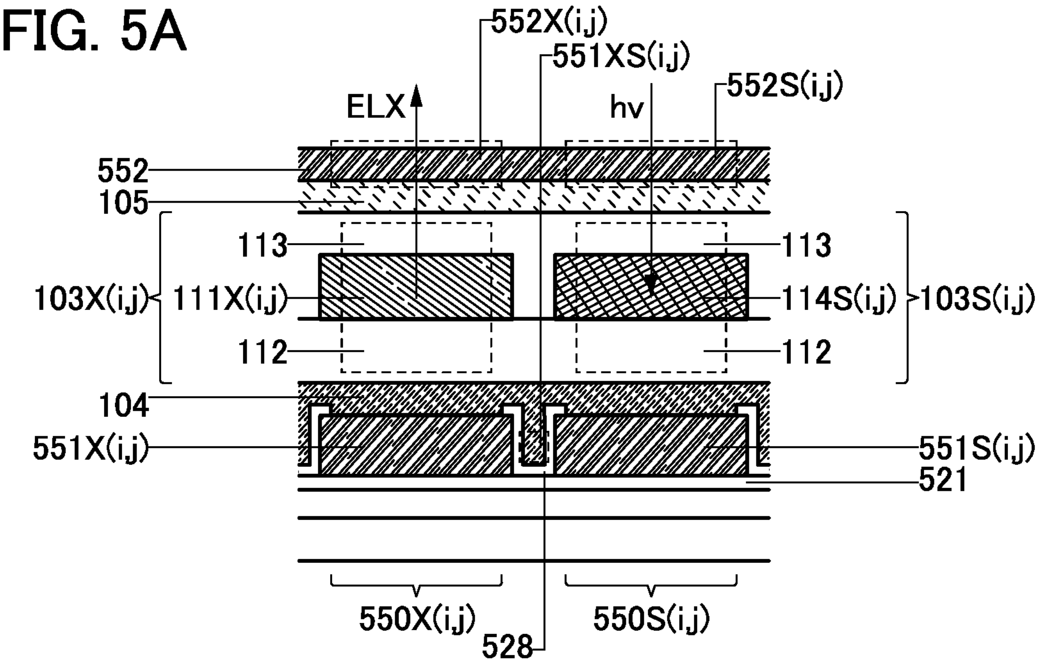
FIGS. 5A and 5B are cross-sectional views illustrating display devices of embodiments.

The display device 700 described in this embodiment includes the light-emitting device 550X(i,j), a photoelectric conversion device 550S(i,j), the insulating film 521, and the conductive film 552 (see FIG. 5A). The display device 700 includes the insulating film 528.

Structure example 3 of display device is different from Structure example 1 of display device in that a photoelectric conversion device 550S(i,j) is included instead of the light-emitting device 550Y(if). Different parts will be described in detail below, and the above description is referred to for parts having the same structure as the above.

<<Structure Example 1 of Photoelectric Conversion Device 550S(i,j)>>

The photoelectric conversion device 550S(i,j) includes an electrode 551S(i,j), an electrode 552S(i,j), and a unit 103S (i,j). The unit 103S(i,j) is located between the electrode 551S(i,j) and the electrode 552S(i,j).

The electrode 551S(i,j) is located between the unit 103S (i,j) and the insulating film 521, and a space 551XS(i,j) is provided between the electrode 551X(i,j) and the electrode 551S(i,j).

For example, the photoelectric conversion device described in Embodiment 6 can be used as the photoelectric conversion device 550S(i,j). Specifically, the structure that can be employed for the electrode 551S can be employed for the electrode 551S(i,j). In addition, the structure that can be employed for the unit 103S can be employed for the unit 103S(i,j).

<<Structure Example 1 of Unit 103S(i,j)>>

The unit 103S(i,j) includes a layer 114S(i,j), the layer 113, and the layer 112 (see FIG. 5A). The layer 114S(i,j) is located between the layer 112 and the layer 113 and contains the electron-accepting material AM and the electron-donating material DM.

A mixed material described in Embodiment 6 containing an electron-accepting material and an electron-donating material can be used for the layer 114S(i,j), for example.

<<Structure Example 2 of Unit 103S(i,j)>>

Figure 5B:
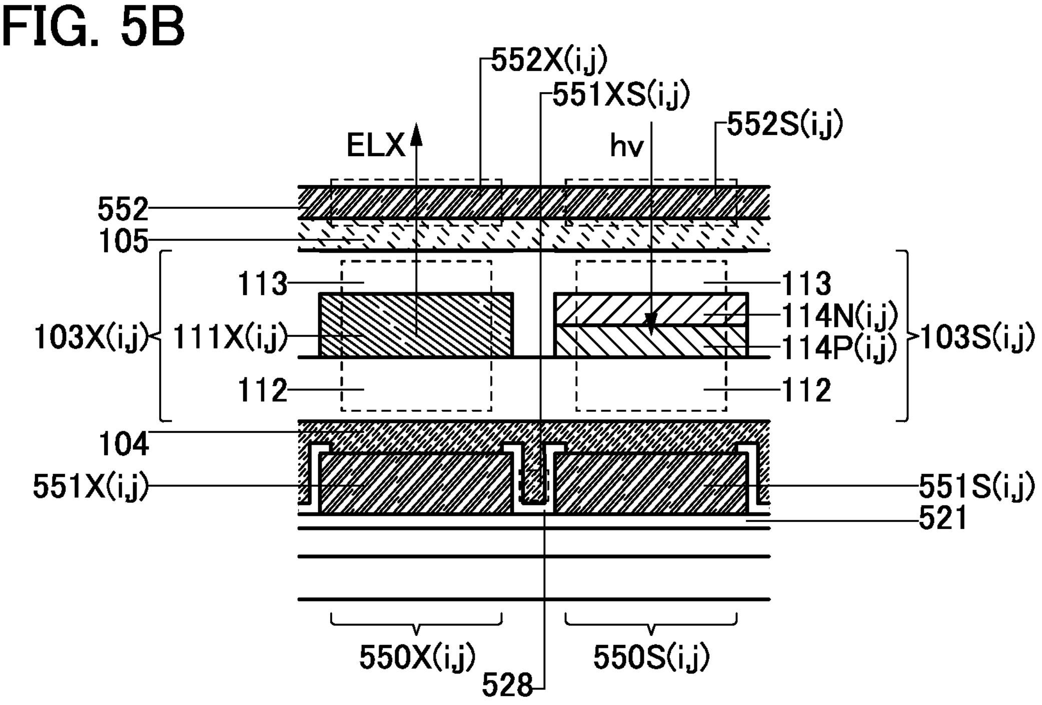

The unit 103S(i,j) includes a layer 114N(i,j), a layer 114P(i,j), the layer 113, and the layer 112 (see FIG. 5B). The layer 114N(i,j) is located between the layer 113 and the layer 114P(i,j), the layer 114P(i,j) is located between the layer 114N(i,j) and the layer 112, and the layer 112 is located between the layer 114P(i,j) and the electrode 551S(i,j).

For example, an n-type semiconductor described in Embodiment 6 can be used for the layer 114N(i,j) and a p-type semiconductor described in Embodiment 6 can be used for the layer 114P(i,j).

Note that this embodiment can be combined with any of the other embodiments in this specification as appropriate.

Embodiment 8

In this embodiment, a light-emitting apparatus including the light-emitting device described in any one of Embodiments 1 to 5 will be described.

Figure 6A:
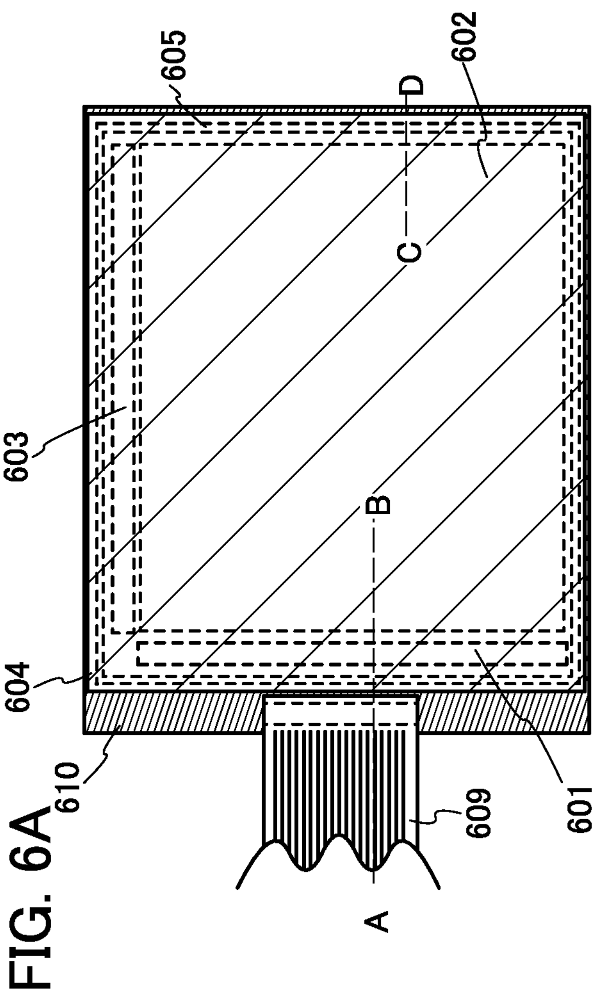
FIGS. 6A and 6B are conceptual diagrams of an active matrix light-emitting apparatus.
Figure 6B:
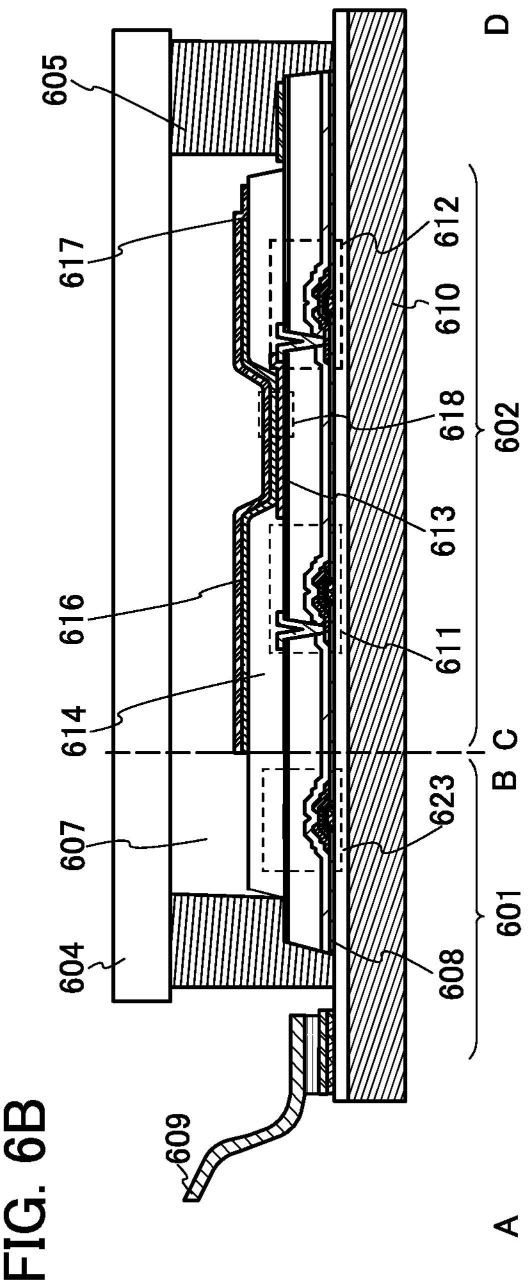

In this embodiment, the light-emitting apparatus fabricated using the light-emitting device described in any one of Embodiments 1 to 5 is described with reference to FIGS. 6A and 6B. Note that FIG. 6A is a top view of the light-emitting apparatus and FIG. 6B is a cross-sectional view taken along the lines A-B and C-D in FIG. 6A. This light-emitting apparatus includes a pixel portion 602 and a driver circuit portion (including a source line driver circuit 601 and a gate line driver circuit 603), which are to control light emission of the light-emitting device and illustrated with dotted lines. The light-emitting apparatus is provided with a sealing substrate 604 and a sealing material 605, and a space 607 is surrounded by the sealing material 605.

A lead wiring 608 is a wiring for transmitting signals to be input to the source line driver circuit 601 and the gate line driver circuit 603 and receives signals such as a video signal, a clock signal, a start signal, and a reset signal from a flexible printed circuit (FPC) serving as an external input terminal 609. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 6B. The driver circuit portions and the pixel portion are formed over an element substrate 610; here, the source line driver circuit 601, which is a driver circuit portion, and one pixel in the pixel portion 602 are illustrated.

The element substrate 610 may be a substrate formed of glass, quartz, an organic resin, a metal, an alloy, or a semiconductor or a plastic substrate formed of fiber reinforced plastics (FRP), poly(vinyl fluoride) (PVF), polyester, an acrylic resin, or the like.

The structures of transistors used in pixels or driver circuits are not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, or gallium nitride can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. It is preferable that a semiconductor having crystallinity be used, in which case deterioration of the transistor characteristics can be suppressed.

Here, an oxide semiconductor is preferably used for semiconductor devices such as the transistors provided in the pixels or driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the source line driver circuit 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside.

The pixel portion 602 includes a plurality of pixels each including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve coverage with an EL layer or the like which is formed later, the insulator 614 is formed to have a curved surface with curvature at its upper or lower end portion. For example, in the case where a positive photosensitive acrylic resin is used for a material of the insulator 614, only the upper end portion of the insulator 614 preferably has a surface with a curvature radius (greater than or equal to 0.2 μm and less than or equal to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, or a stack of three layers of a titanium nitride film, a film containing aluminum as its main component, and a titanium nitride film can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any one of Embodiments 1 to 5. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in any one of Embodiments 1 to 5. In the light-emitting apparatus of this embodiment, the pixel portion, which includes a plurality of light-emitting devices, may include both the light-emitting device described in any one of Embodiments 1 to 5 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is preferable that such a material not be permeable to moisture and oxygen as much as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 6A and 6B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, or indium oxide; a material containing aluminum nitride, hafnium nitride, silicon nitride, tantalum nitride, titanium nitride, niobium nitride, molybdenum nitride, zirconium nitride, or gallium nitride; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, or an oxide containing yttrium and zirconium can be used.

The protective film is preferably formed using a deposition method with favorable step coverage. One such method is an ALD method. A material that can be formed by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and rear surfaces of a touch panel.

As described above, the light-emitting apparatus fabricated using the light-emitting device described in any one of Embodiments 1 to 5 can be obtained.

The light-emitting apparatus in this embodiment is fabricated using the light-emitting device described in any one of Embodiments 1 to 5 and thus can have favorable characteristics. Specifically, since the light-emitting device described in any one of Embodiments 1 to 5 has high emission efficiency, the light-emitting apparatus can achieve low power consumption.

Figure 7A:
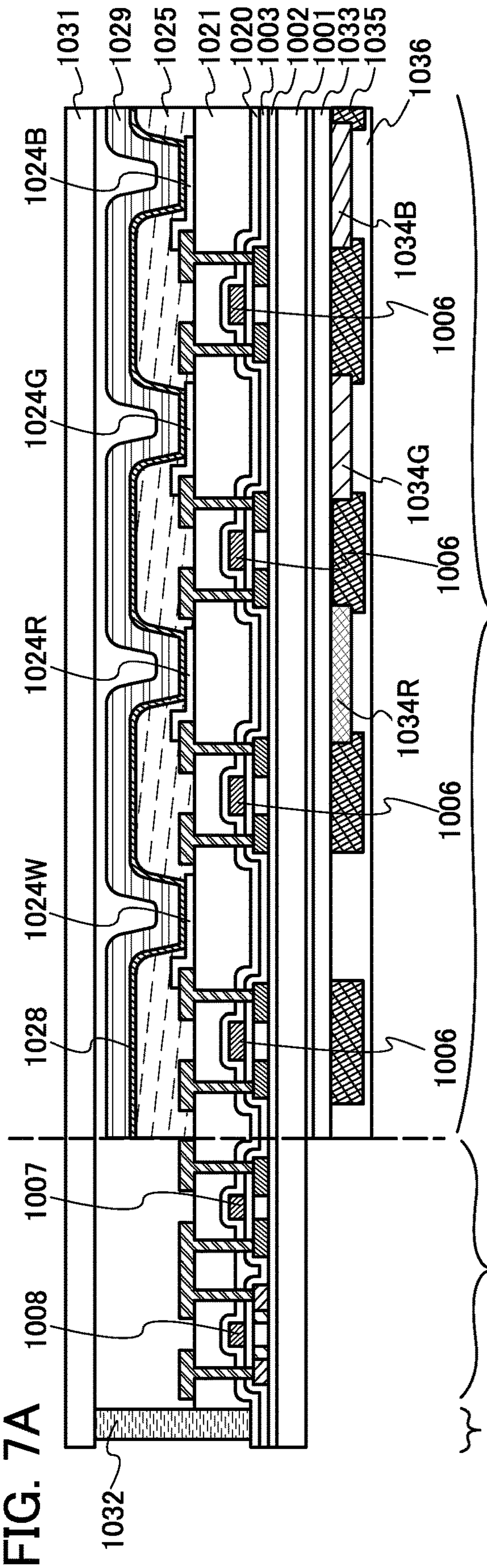
FIGS. 7A and 7B are conceptual diagrams of active matrix light-emitting apparatuses.
Figure 7B:
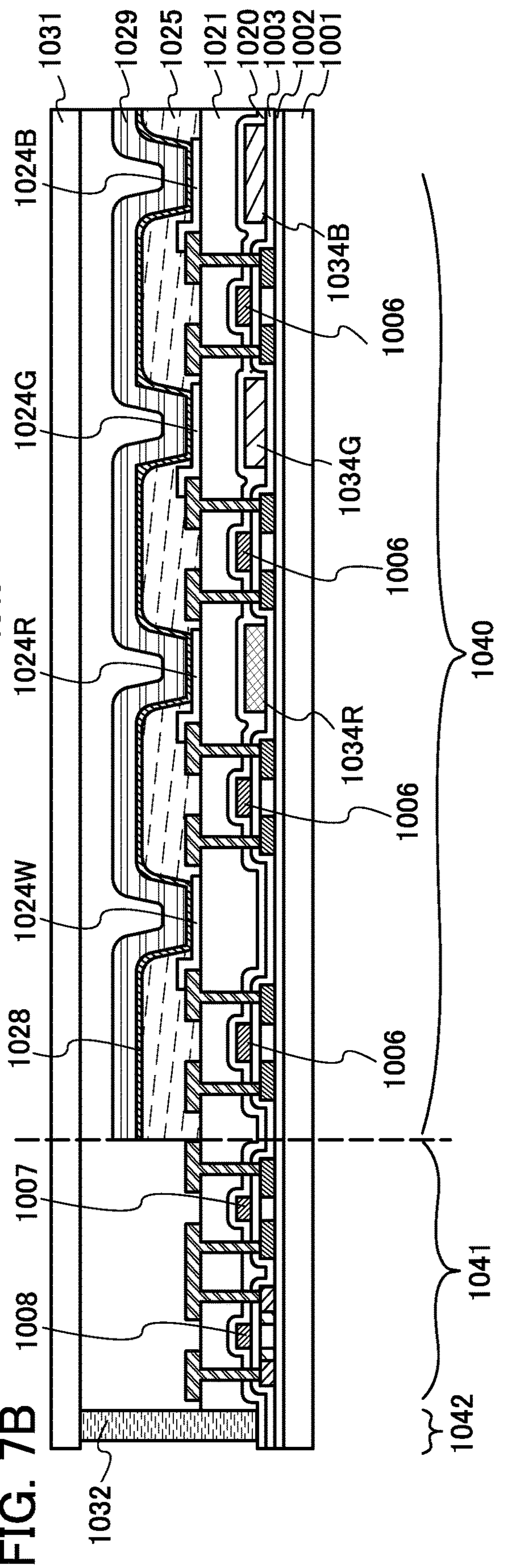

FIGS. 7A and 7B each illustrate an example of a light-emitting apparatus that includes a light-emitting device exhibiting white light emission, coloring layers (color filters), and the like to display a full-color image. In FIG. 7A, a substrate 1001, a base insulating film 1002, a gate insulating film 1003, a gate electrode 1006, a gate electrode 1007, and a gate electrode 1008, a first interlayer insulating film 1020, a second interlayer insulating film 1021, a peripheral portion 1042, a pixel portion 1040, a driver circuit portion 1041, electrodes 1024W, 1024R, 1024G, and 1024B of light-emitting devices, a partition 1025, an EL layer 1028, an electrode 1029 of the light-emitting devices, a sealing substrate 1031, a sealing material 1032, and the like are illustrated.

In FIG. 7A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 7A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 7B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 8:
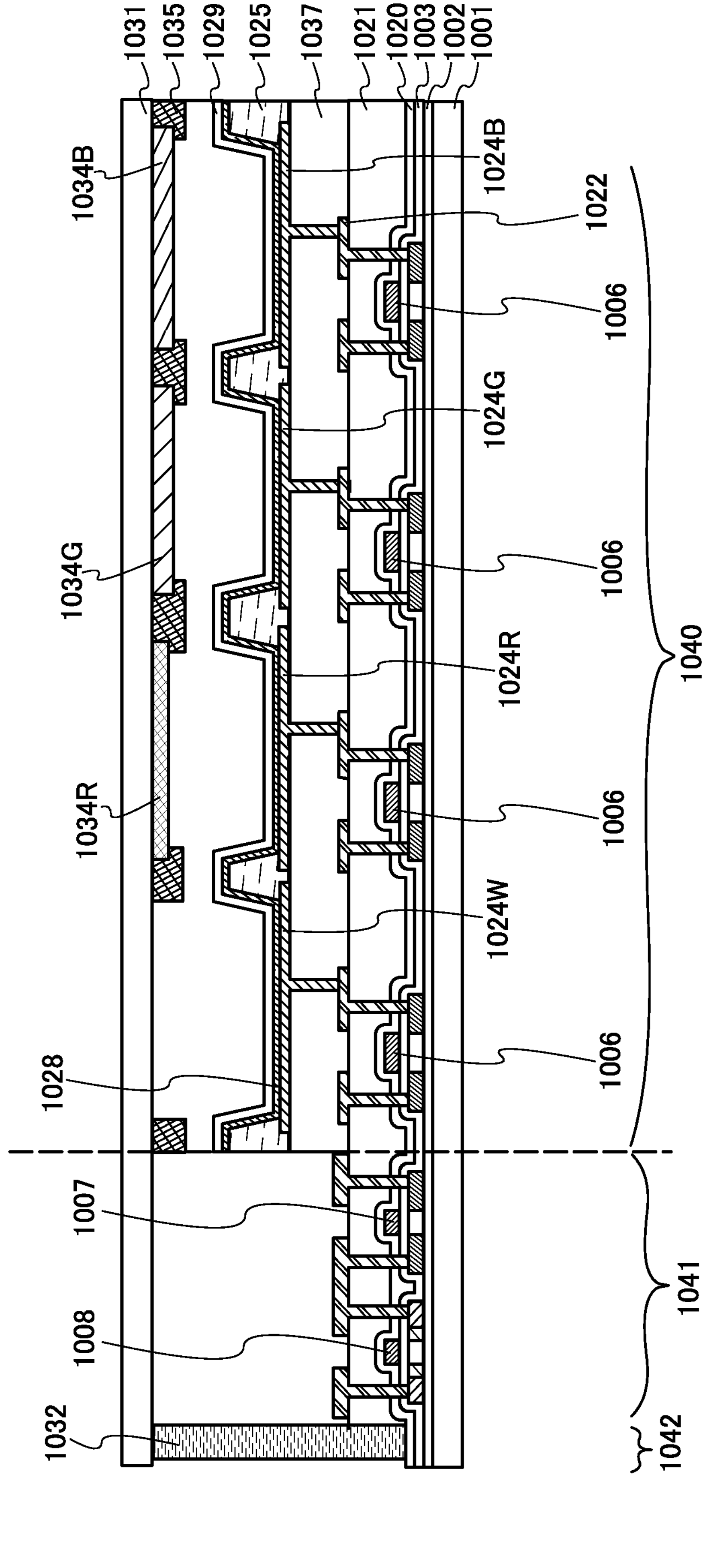
FIG. 8 is a conceptual diagram of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 8 is a cross-sectional view of a light-emitting apparatus having a top emission structure. In this case, a substrate which does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The electrodes 1024W, 1024R, 1024G, and 1024B of the light-emitting devices each serve as an anode here, but may serve as a cathode. Furthermore, in the case of the top-emission light-emitting apparatus illustrated in FIG. 8, the electrodes are preferably reflective electrodes. The EL layer 1028 is formed to have a structure similar to the structure of the unit 103, which is described in any one of Embodiments 1 to 5, with which white light emission can be obtained.

In the case of a top emission structure as illustrated in FIG. 8, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) or the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with use of a reflective electrode as the first electrode and a semi-transmissive and semi-reflective electrode as the second electrode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity higher than or equal to 40% and lower than or equal to 100%, preferably higher than or equal to 70% and lower than or equal to 100%, and a resistivity of $1\times10^{-2}$ Ωcm or lower. In addition, the semi-transmissive and semi-reflective electrode has a visible light reflectivity higher than or equal to 20% and lower than or equal to 80%, preferably higher than or equal to 40% and lower than or equal to 70%, and a resistivity of $1\times10^{-2}$ Ωcm or lower.

Light emitted from the light-emitting layer included in the EL layer is reflected and resonated by the reflective electrode and the semi-transmissive and semi-reflective electrode.

In the light-emitting device, by changing the thickness of the transparent conductive film, the composite material, the carrier-transport material, or the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is fabricated using the light-emitting device described in any one of Embodiments 1 to 5 and thus can have favorable characteristics. Specifically, since the light-emitting device described in any one of Embodiments 1 to 5 has high emission efficiency, the light-emitting apparatus can achieve low power consumption.

Figure 9A:
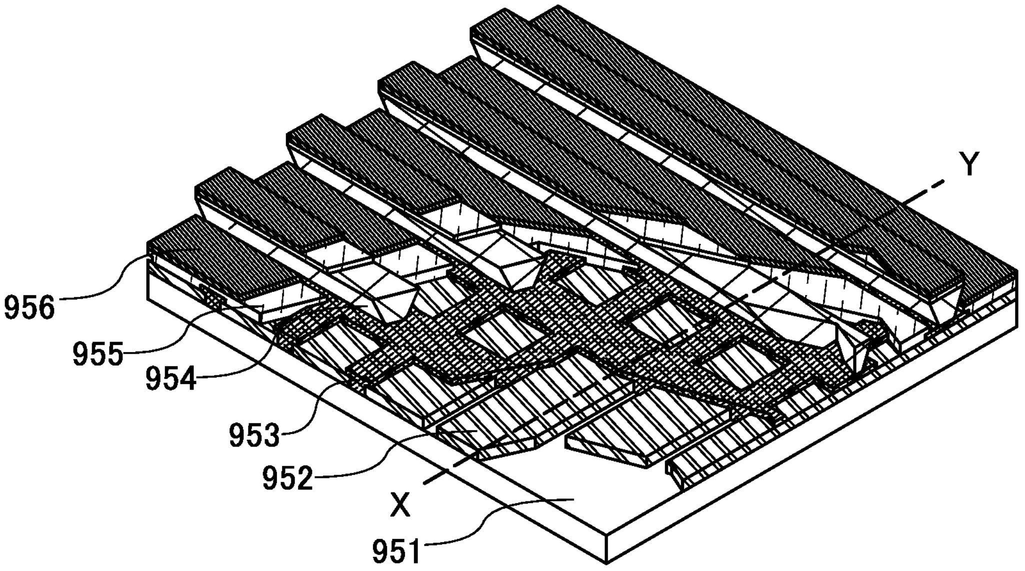
FIGS. 9A and 9B are conceptual diagrams of a passive matrix light-emitting apparatus.
Figure 9B:
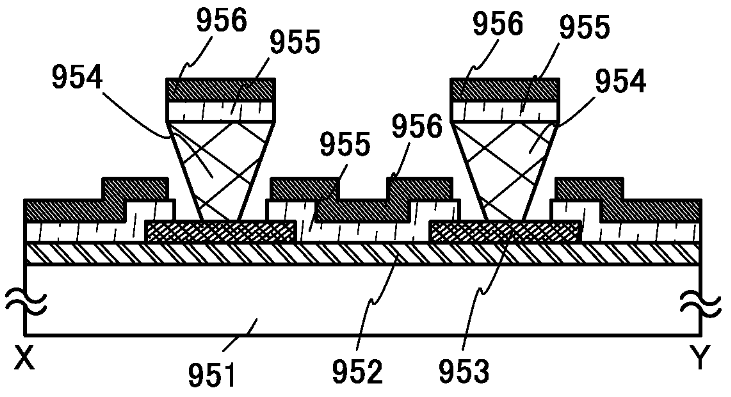

An active matrix light-emitting apparatus is described above, whereas a passive matrix light-emitting apparatus is described below. FIGS. 9A and 9B illustrate a passive matrix light-emitting apparatus manufactured using the present invention. Note that FIG. 9A is a perspective view of the light-emitting apparatus, and FIG. 9B is a cross-sectional view taken along the line X-Y in FIG. 9A. In FIGS. 9A and 9B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in any one of Embodiments 1 to 5; thus, the light-emitting apparatus can have high reliability or low power consumption.

Since many minute light-emitting devices arranged in a matrix in the light-emitting apparatus described above can each be controlled, the light-emitting apparatus can be suitably used as a display device for displaying images.

This embodiment can be freely combined with any of the other embodiments.

Embodiment 9

Figure 10A:
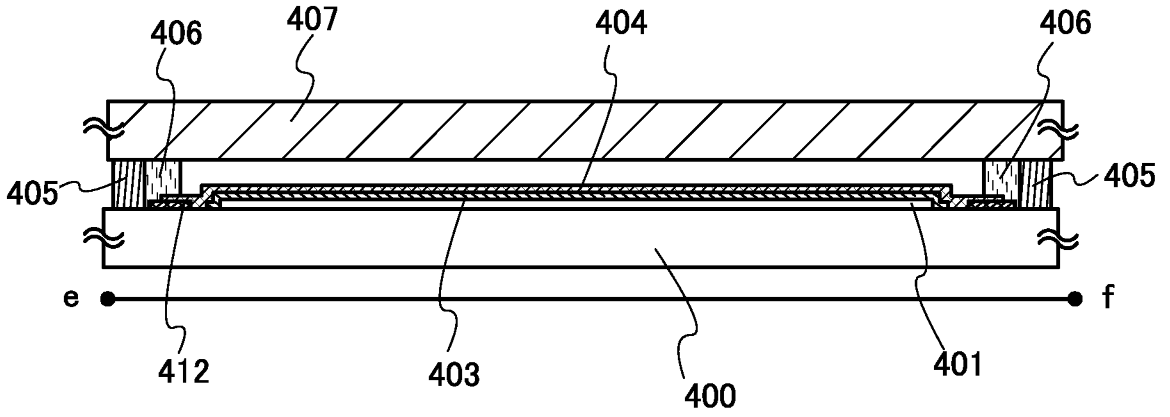
FIGS. 10A and 10B illustrate a lighting device.
Figure 10B:
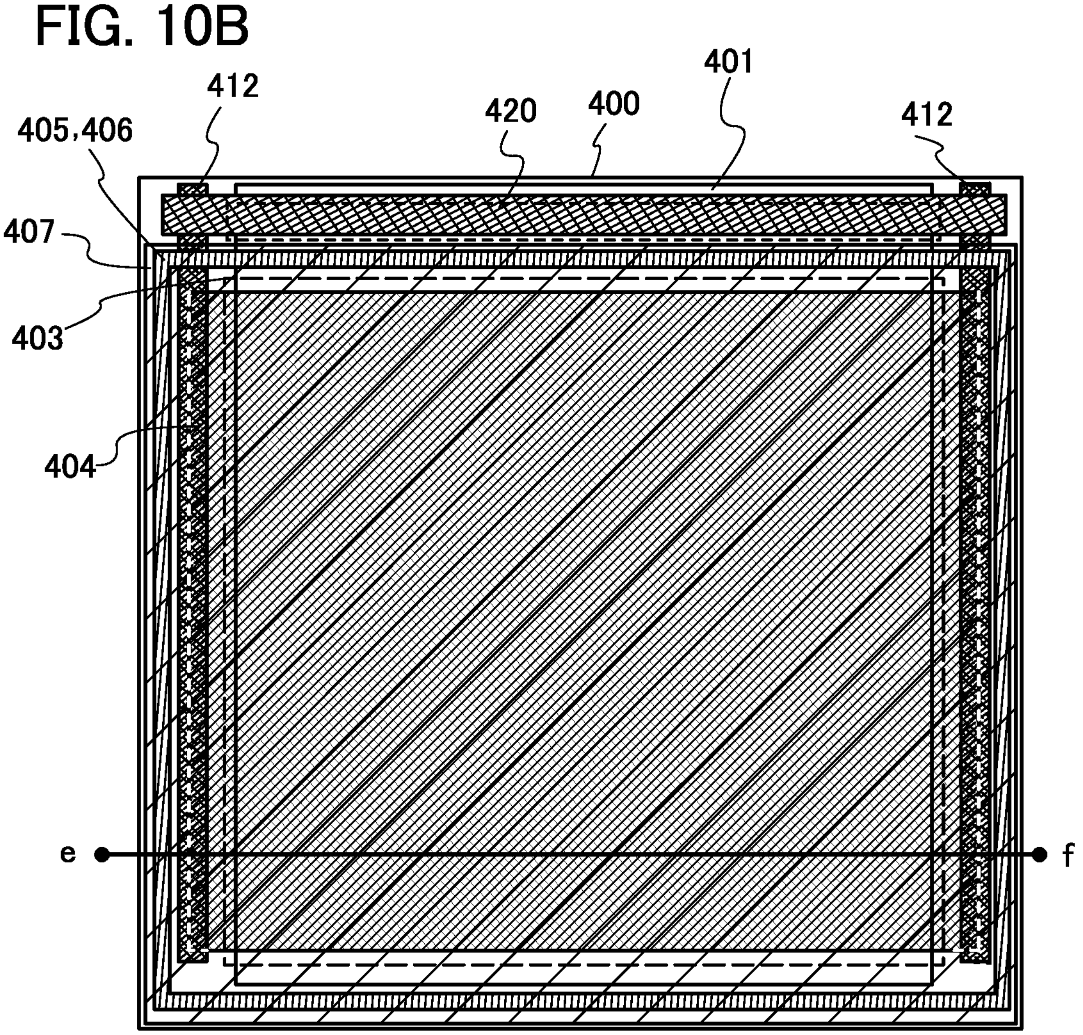

In this embodiment, an example in which the light-emitting device described in any one of Embodiments 1 to 5 is used for a lighting device will be described with reference to FIGS. 10A and 10B. FIG. 10B is a top view of the lighting device, and FIG. 10A is a cross-sectional view taken along the line e-f in FIG. 10B.

In the lighting device in this embodiment, a first electrode 401 is formed over a substrate 400 which is a support and has a light-transmitting property. The first electrode 401 corresponds to the electrode 551X in any one of Embodiments 1 to 5. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The EL layer 403 corresponds to the structure in which the layer 104, the unit 103, and the layer 105 are combined, the structure in which the layer 104, the unit 103, the intermediate layer 106, the unit 103_2, and the layer 105 are combined, or the like in any one of Embodiments 1 to 5. Refer to the corresponding description for these structures.

The second electrode 404 is formed to cover the EL layer 403. The second electrode 404 corresponds to the electrode 552X in any one of Embodiments 1 to 5. The second electrode 404 is formed using a material having high reflectance when light is extracted from the first electrode 401 side. The second electrode 404 is connected to the pad 412, whereby voltage is applied.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can be a lighting device with low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 10B) can be mixed with a desiccant that enables moisture to be adsorbed, which results in improved reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes, as an EL element, the light-emitting device described in any one of Embodiments 1 to 5, and thus can be a lighting device with low power consumption.

Embodiment 10

In this embodiment, examples of electronic devices each including the light-emitting device described in any one of Embodiments 1 to 5 will be described. The light-emitting device described in any one of Embodiments 1 to 5 has high emission efficiency and low power consumption. As a result, the electronic devices described in this embodiment can each include a light-emitting portion having low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 11A:
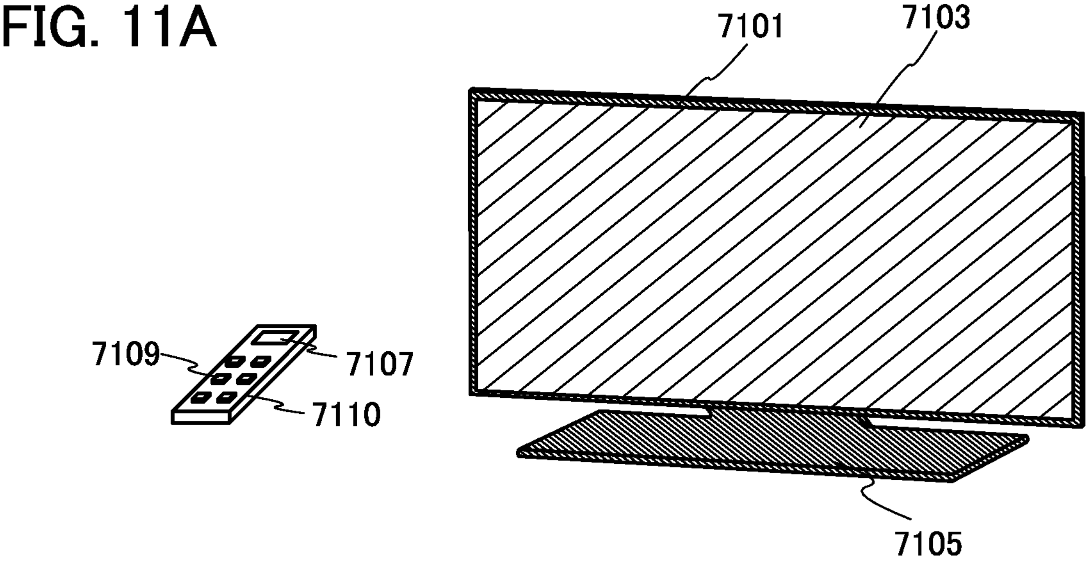
FIGS. 11A to 11D illustrate electronic devices.

FIG. 11A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in any one of Embodiments 1 to 5 are arranged in a matrix.

The television device can be operated with an operation switch of the housing 7101 or a separate remote controller 7110. With operation keys 7109 of the remote controller 7110, channels or volume can be controlled and images displayed on the display portion 7103 can be controlled. Furthermore, the remote controller 7110 may be provided with a display portion 7107 and data output from the remote controller 7110 may be displayed on display portion 7107.

Note that the television device is provided with a receiver, a modem, or the like. With use of the receiver, a general television broadcast can be received. Moreover, when the television device is connected to a communication network with or without wires via the modem, one-way (from a sender to a receiver) or two-way (between a sender and a receiver or between receivers) data communication can be performed.

Figure 11B:
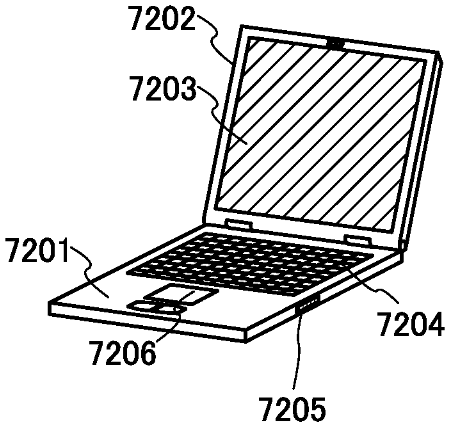
Figure 11C:
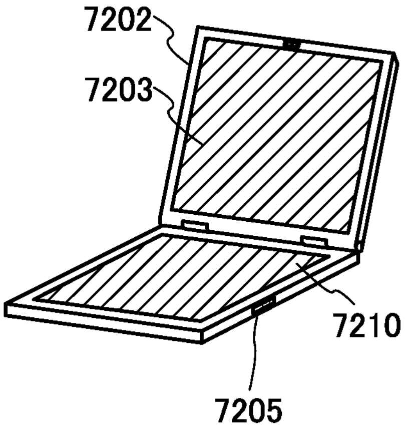

FIG. 11B illustrates a computer, which includes a main body 7201, a housing 7202, a display portion 7203, a keyboard 7204, an external connection port 7205, a pointing device 7206, and the like. Note that this computer is fabricated using the light-emitting devices described in any one of Embodiments 1 to 5 and arranged in a matrix in the display portion 7203. The computer illustrated in FIG. 11B may have a structure illustrated in FIG. 11C. A computer illustrated in FIG. 11C is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 11D:
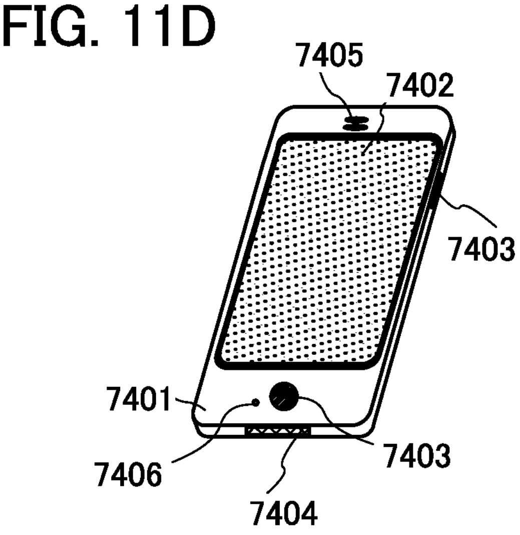

FIG. 11D shows an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting devices described in any one of Embodiments 1 to 5 and arranged in a matrix.

When the display portion 7402 of the portable terminal illustrated in FIG. 11D is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Figure 12A:
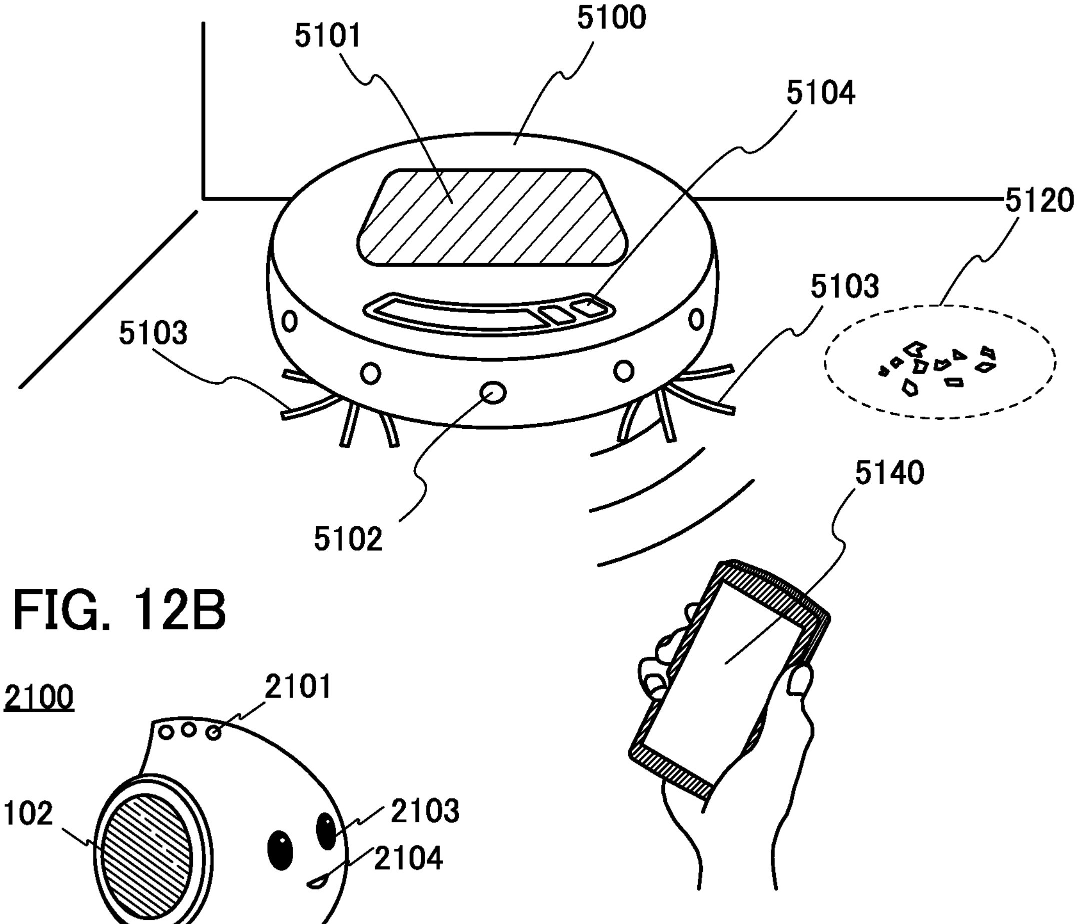
FIGS. 12A to 12C illustrate electronic devices.

FIG. 12A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, or the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 12B:
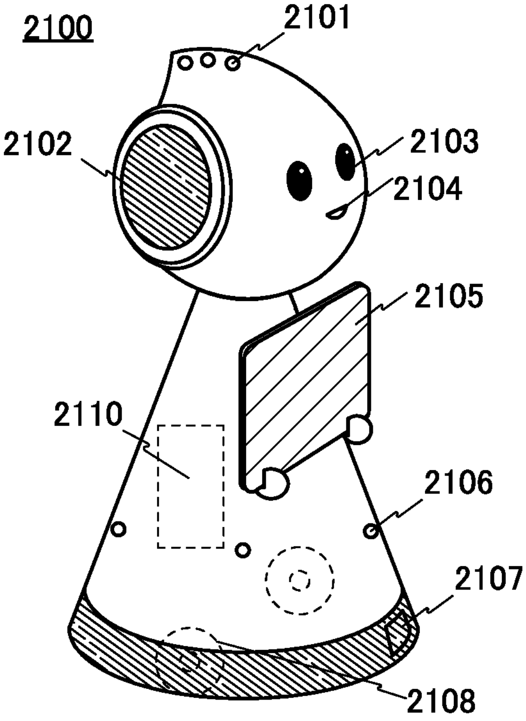

A robot 2100 illustrated in FIG. 12B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 12C:
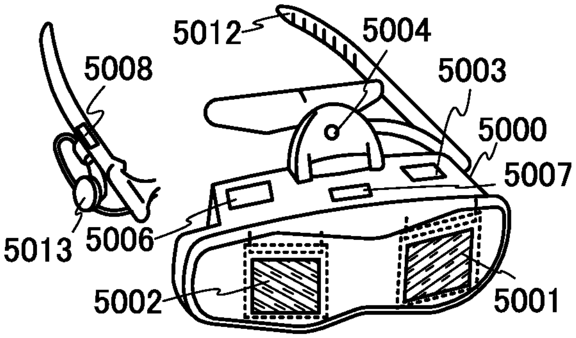

FIG. 12C shows an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, a display portion 5002, a support 5012, and an earphone 5013.

The light-emitting apparatus of one embodiment of the present invention can be used for the display portion 5001 and the display portion 5002.

Figure 13:
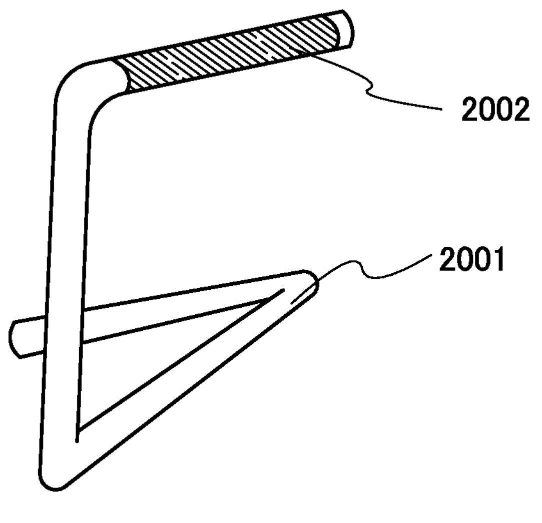
FIG. 13 illustrates a lighting device.

FIG. 13 shows an example in which the light-emitting device described in any one of Embodiments 1 to 5 is used for a table lamp which is a lighting device. The table lamp illustrated in FIG. 13 includes a housing 2001 and a light source 2002, and the lighting device described in Embodiment 9 may be used for the light source 2002.

Figure 14:
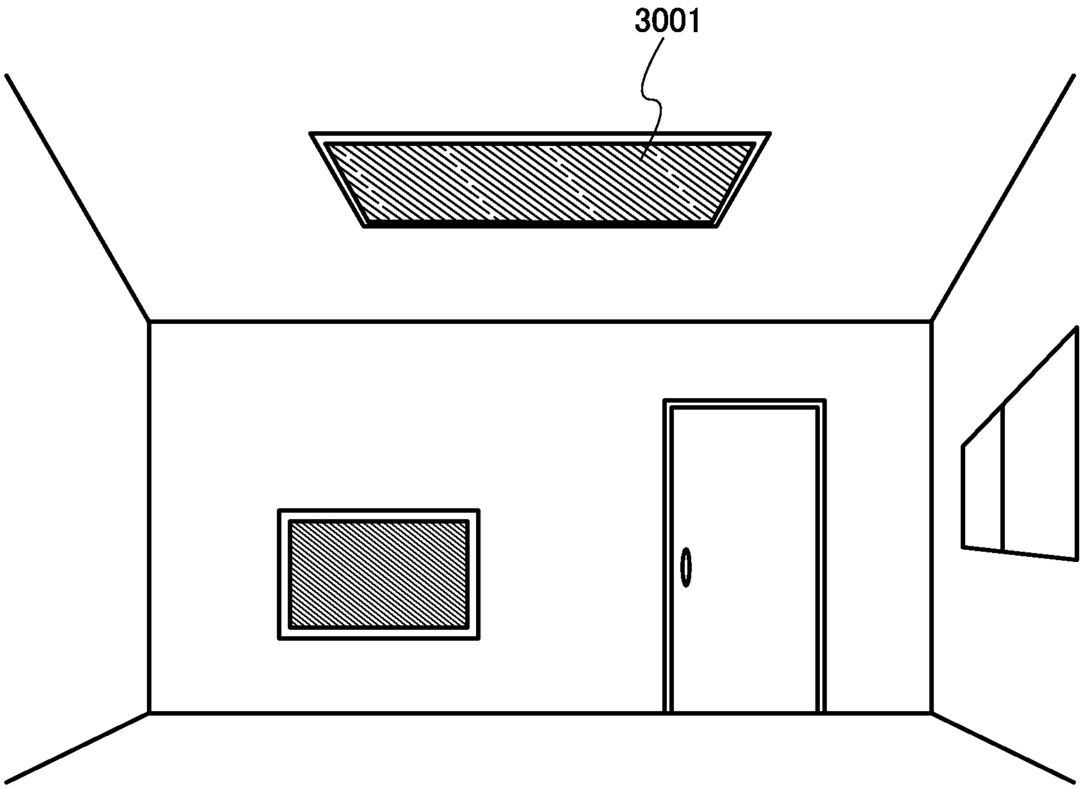
FIG. 14 illustrates a lighting device.

FIG. 14 shows an example in which the light-emitting device described in any one of Embodiments 1 to 5 is used for an indoor lighting device 3001. Since the light-emitting device described in any one of Embodiments 1 to 5 has high emission efficiency, the lighting device can have low power consumption. Furthermore, since the light-emitting device described in any one of Embodiments 1 to 5 can have a large area, the light-emitting device can be used for a large-area lighting device. Furthermore, since the light-emitting device described in any one of Embodiments 1 to 5 is thin, the light-emitting device can be used for a thin lighting device.

Figure 15:
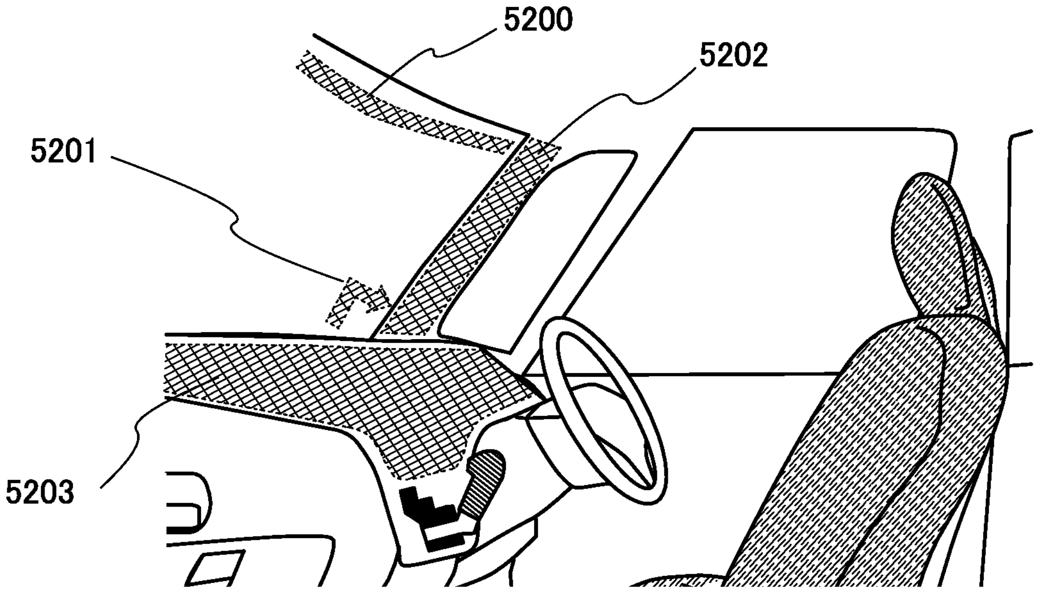
FIG. 15 illustrates in-vehicle display devices and lighting devices.

The light-emitting device described in any one of Embodiments 1 to 5 can also be used for an automobile windshield or an automobile dashboard. FIG. 15 illustrates one mode in which the light-emitting device described in any one of Embodiments 1 to 5 is used for an automobile windshield or an automobile dashboard. Display regions 5200 to 5203 each include the light-emitting device described in any one of Embodiments 1 to 5.

The display regions 5200 and 5201 are display devices which are provided in the automobile windshield and in which the light-emitting device described in any one of Embodiments 1 to 5 is incorporated. The light-emitting device described in any one of Embodiments 1 to 5 can be formed into what is called a see-through display device, through which the opposite side can be seen, by including a first electrode and a second electrode having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in any one of Embodiments 1 to 5 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information by displaying navigation data, speed, a tachometer, a mileage, a fuel level, a gearshift state, air-condition setting, and the like. The content or layout of the display can be changed freely by a user as appropriate. Note that such information can also be displayed on the display regions 5200 to 5202. The display regions 5200 to 5203 can also be used as lighting devices.

Figure 16A:
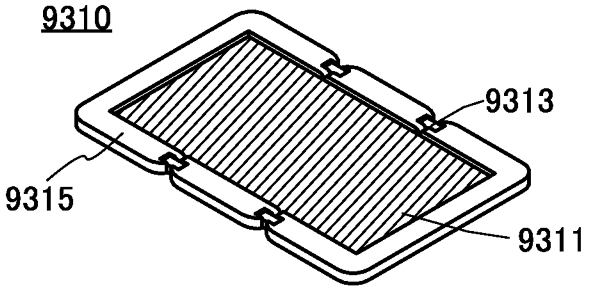
FIGS. 16A to 16C illustrate an electronic device.
Figure 16B:
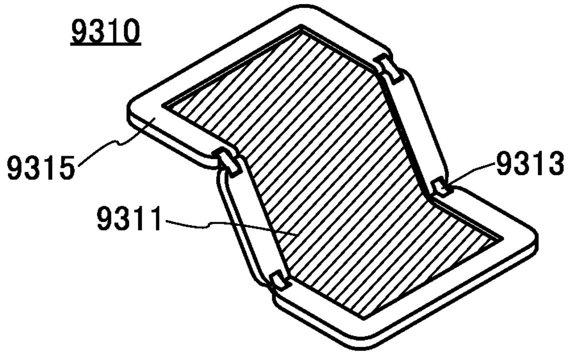
Figure 16C:
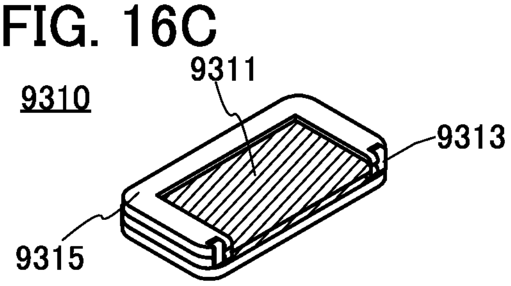

FIGS. 16A to 16C illustrate a foldable portable information terminal 9310. FIG. 16A illustrates the portable information terminal 9310 that is opened. FIG. 16B illustrates the portable information terminal 9310 in the middle of change from one of an opened state and a folded state to the other. FIG. 16C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structure described in this embodiment can be combined with any of the structures described in Embodiments 1 to 5 as appropriate.

As described above, the application range of the light-emitting apparatus including the light-emitting device described in any one of Embodiments 1 to 5 is wide, and thus the light-emitting apparatus can be applied to electronic devices in a variety of fields. By using the light-emitting device described in any one of Embodiments 1 to 5, an electronic device with low power consumption can be obtained.

Note that this embodiment can be combined with any of the other embodiments in this specification as appropriate.

Example 1

In this example, a light-emitting device 1, which is an example of a light-emitting device of one embodiment of the present invention, is described with reference to FIG. 17, FIG. 18, FIG. 19, FIG. 20, FIG. 21, FIG. 22, FIG. 23, FIG. 24, and FIG. 25.

Figure 17:
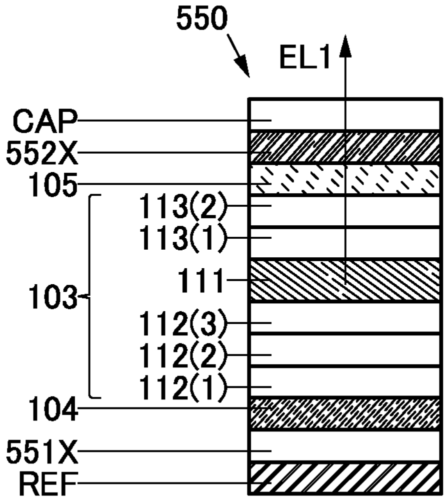
FIG. 17 illustrates a structure of a light-emitting device of an example.

FIG. 17 illustrates a structure of the light-emitting device 550.

Figure 18:
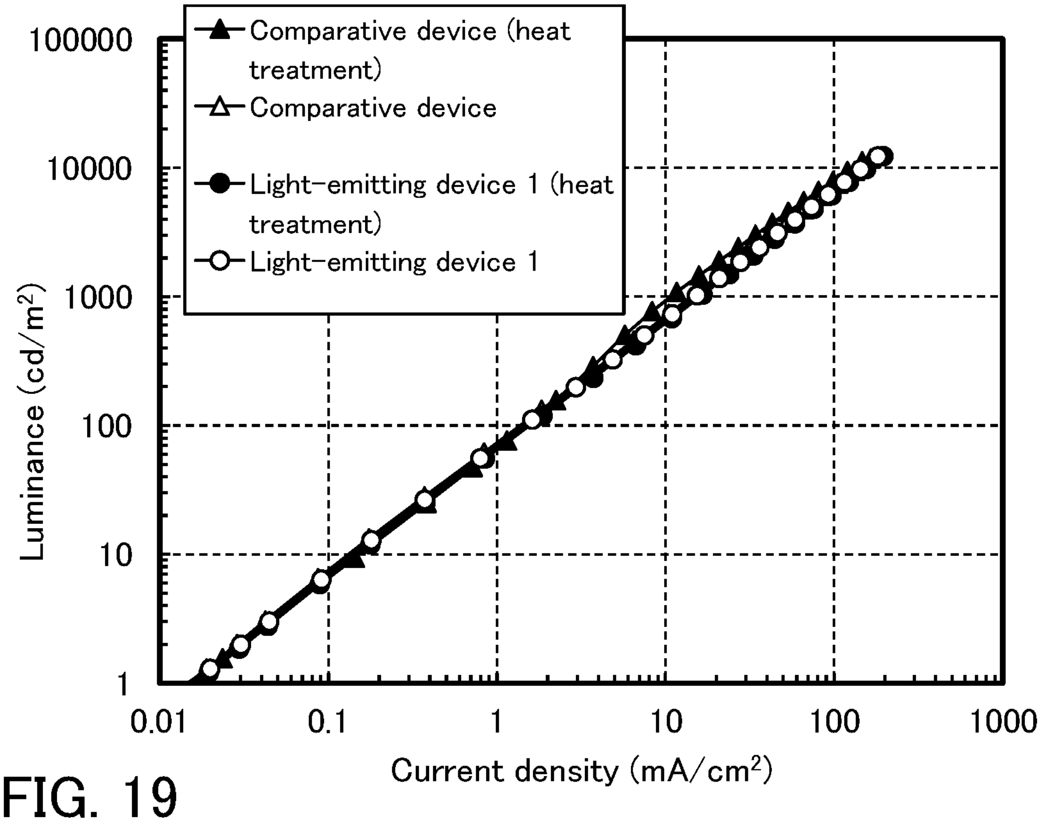
FIG. 18 is a graph showing current density-luminance characteristics of light-emitting devices of an example.

FIG. 18 is a graph showing current density-luminance characteristics of the light-emitting device 1.

Figure 19:
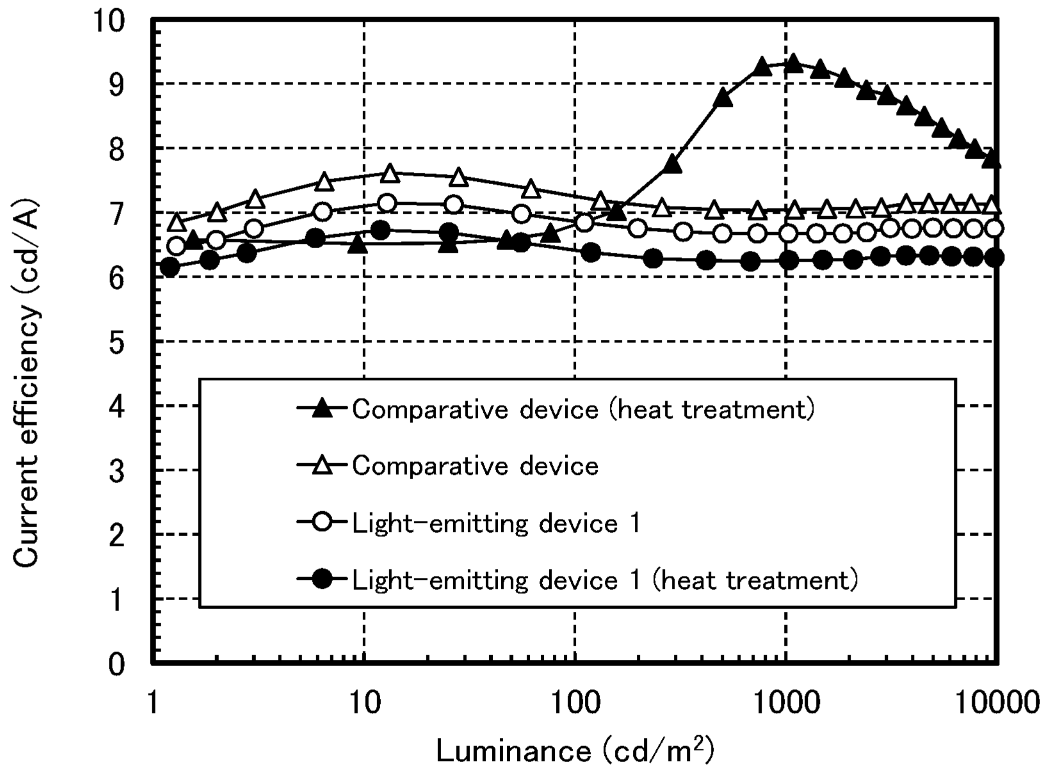
FIG. 19 is a graph showing luminance-current efficiency characteristics of light-emitting devices of an example.

FIG. 19 is a graph showing luminance-current efficiency characteristics of the light-emitting device 1.

Figure 20:
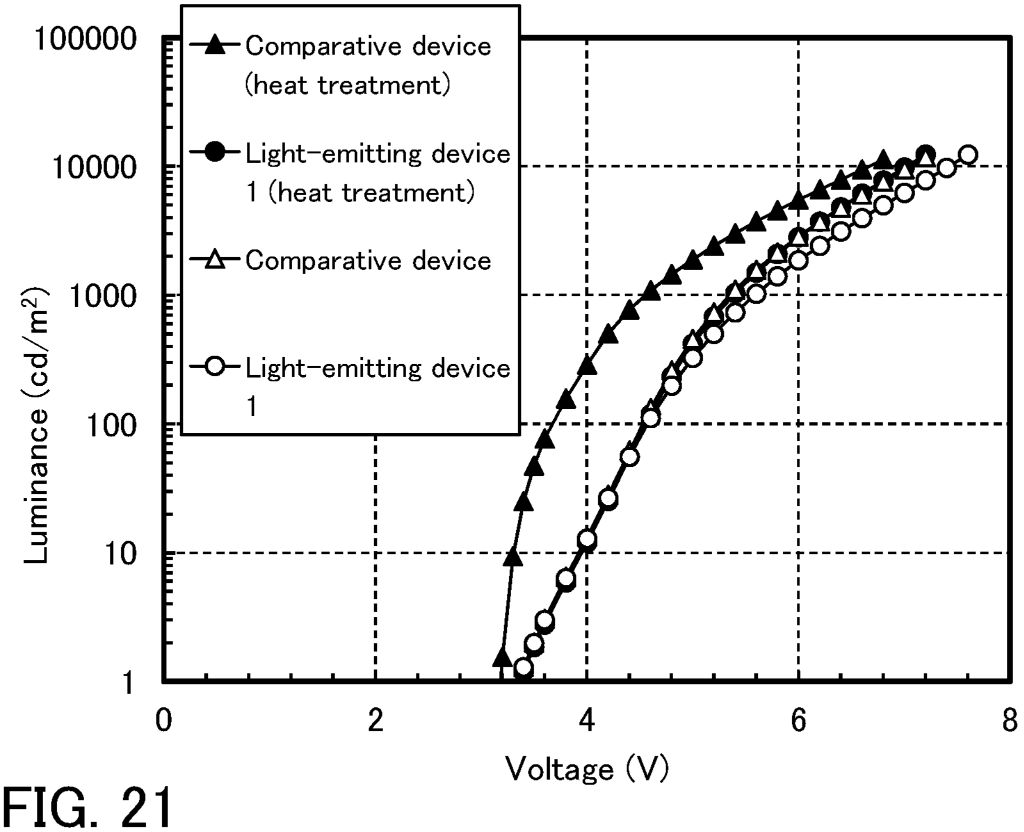
FIG. 20 is a graph showing voltage-luminance characteristics of light-emitting devices of an example.

FIG. 20 is a graph showing voltage-luminance characteristics of the light-emitting device 1.

Figure 21:
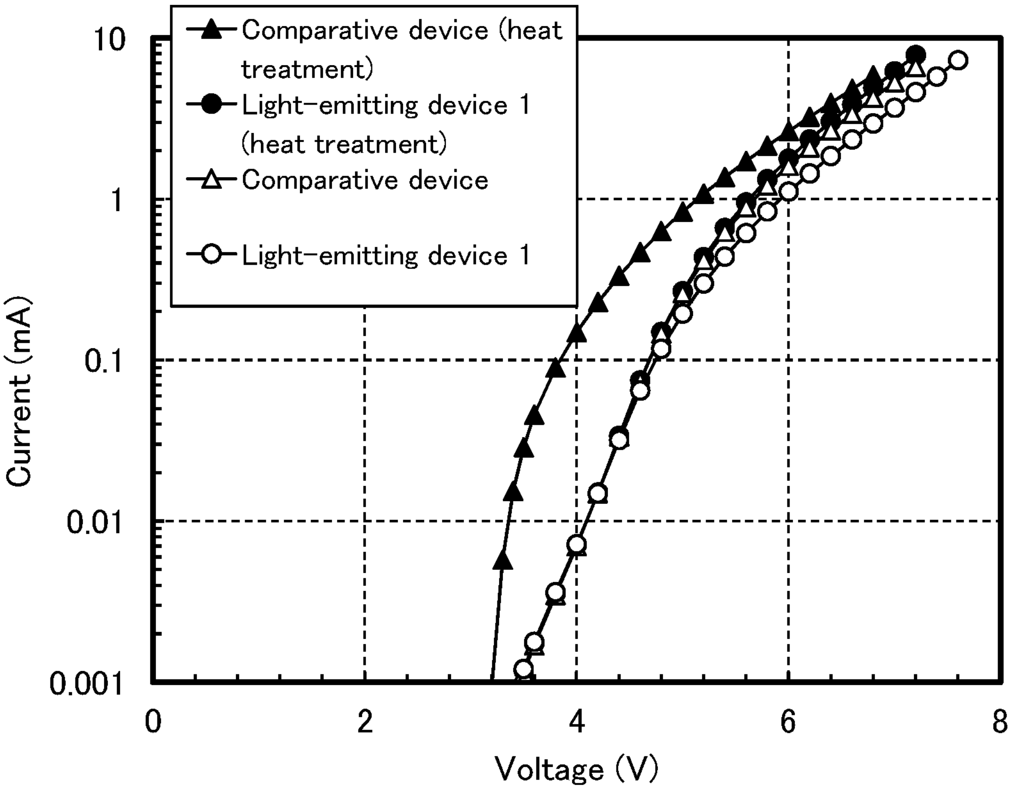
FIG. 21 is a graph showing voltage-current characteristics of light-emitting devices of an example.

FIG. 21 is a graph showing voltage-current characteristics of the light-emitting device 1.

Figure 22:
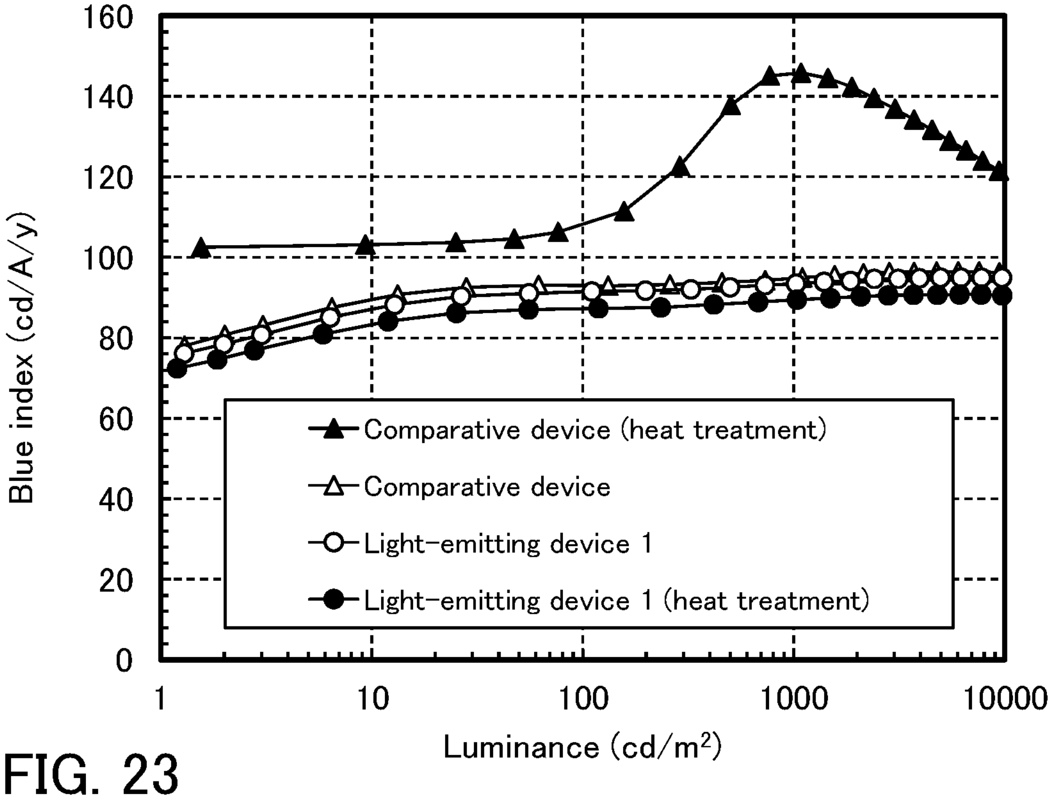
FIG. 22 is a graph showing luminance-blue index characteristics of light-emitting devices of an example.

FIG. 22 is a graph showing luminance-blue index characteristics of the light-emitting device 1.

Figure 23:
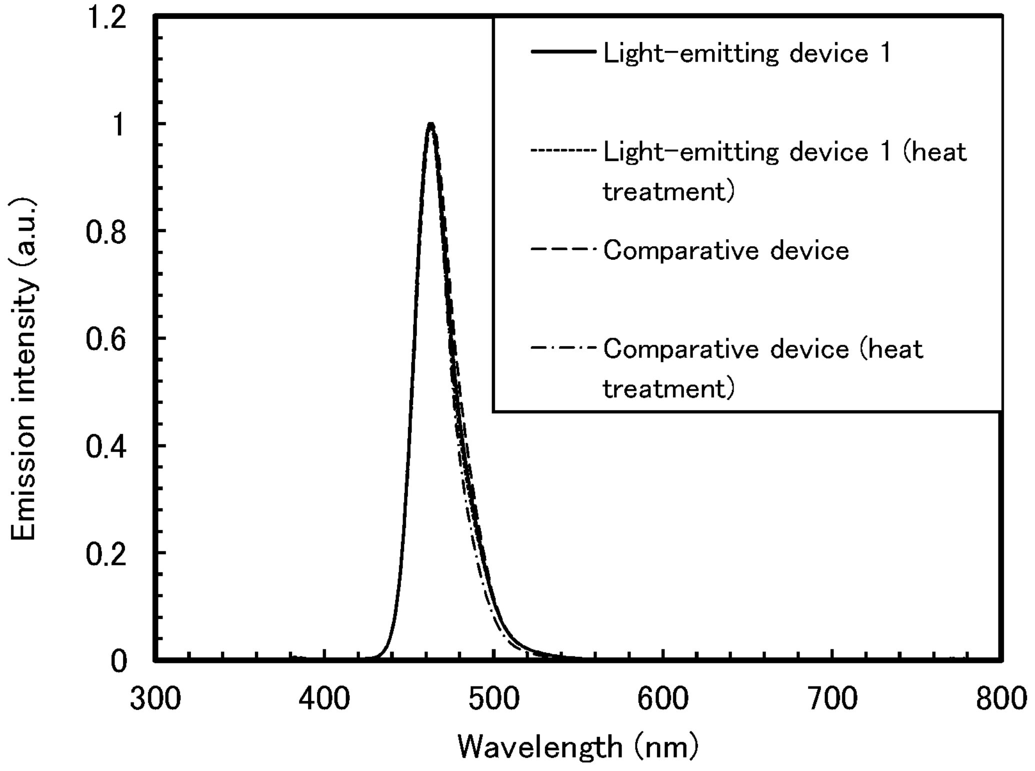
FIG. 23 is a graph showing emission spectra of light-emitting devices of an example.

FIG. 23 is a graph showing an emission spectrum of the light-emitting device 1 emitting light at a luminance of 1000 $cd/m^2$.

Figure 24:
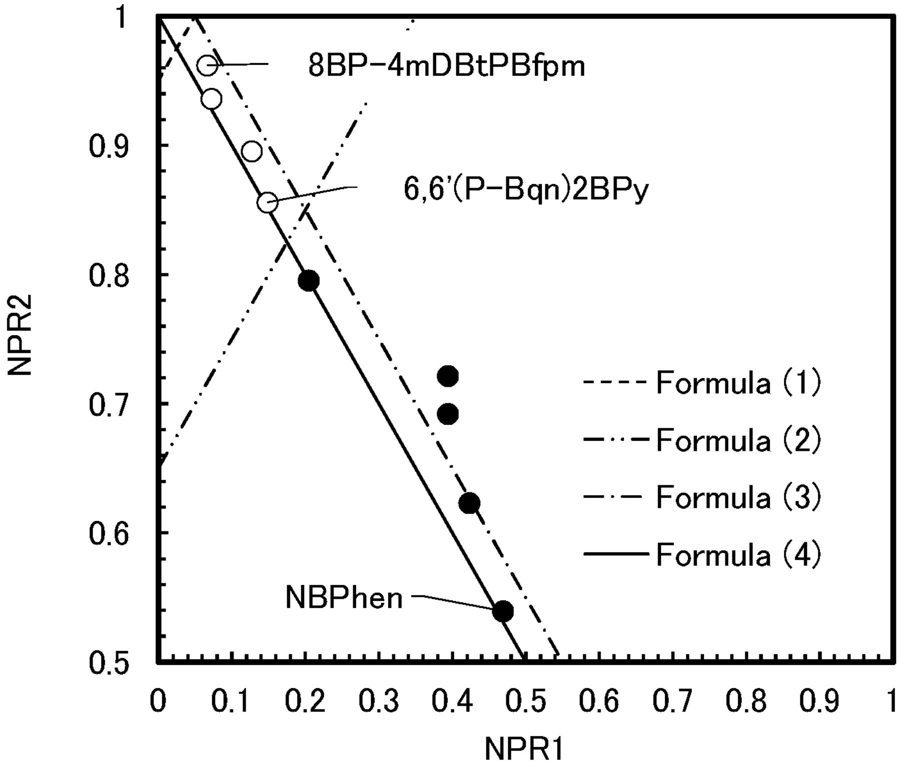
FIG. 24 is a graph showing principal moments of inertia of organic compounds.

FIG. 24 is a graph in which second normalized principal moments of inertia NPR2 are plotted with respect to first normalized principal moments of inertia NPR1 of respective organic compounds.

Figure 25:
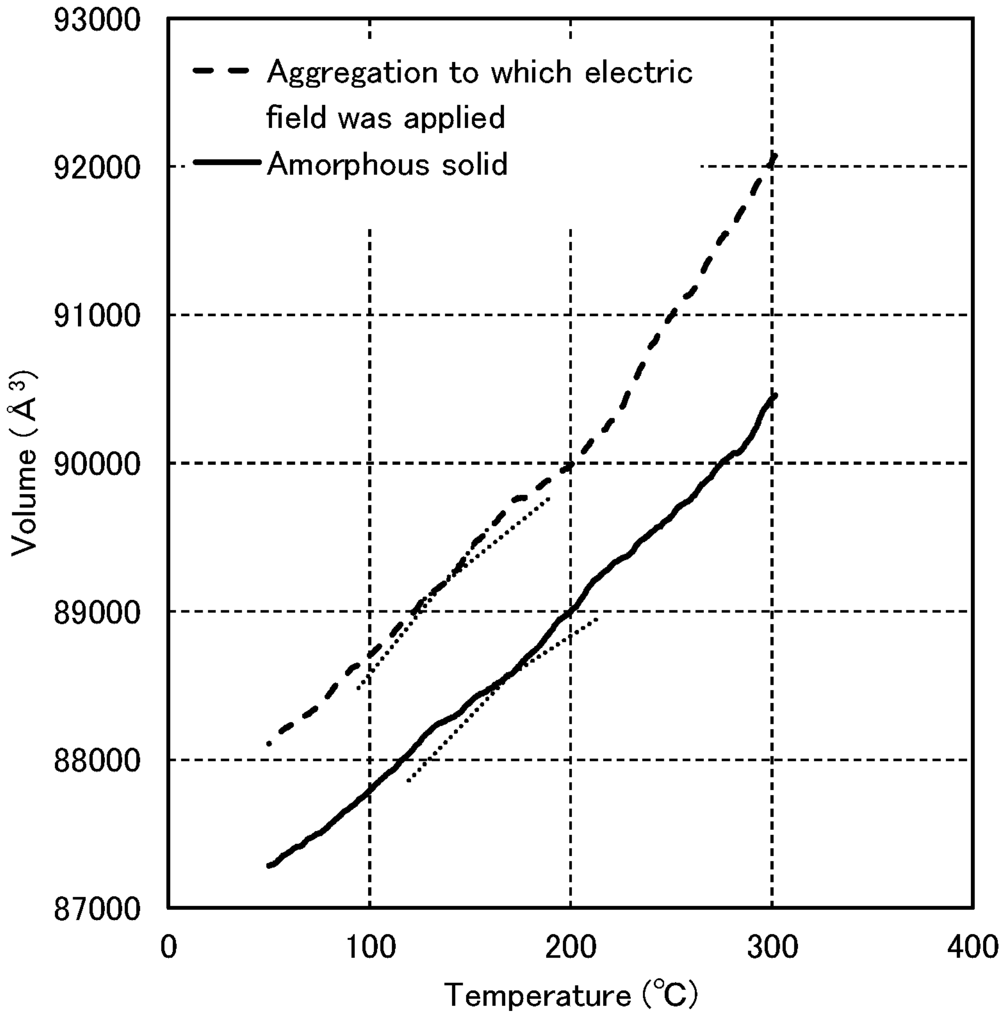
FIG. 25 is a graph showing temperature-volume characteristics of films each containing an organic compound.

FIG. 25 is a graph showing temperature-volume characteristics, which were obtained through simulation, of a film containing an organic compound.

<Light-Emitting Device 1>

The fabricated light-emitting device 1, which is described in this example, has a structure similar to that of the light-emitting device 550 (see FIG. 17).

<<Structure of Light-Emitting Device 1>>

Table 1 shows the structure of the light-emitting device 1. Structural formulae of materials used in the light-emitting devices described in this example are shown below. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 1

| Component | Reference numeral | Material | Composition ratio | Thickness/nm |
|---|---|---|---|---|
| Layer | CAP | DBT3P-II | | 80 |
| Electrode | 552X | Ag:Mg | 1:0.1 | 15 |
| Layer | 105 | LiF | | 1 |
| Layer | 113(2) | 6,6'(P-Bqn)2BPy | | 20 |
| Layer | 113(1) | 8BP-4mDBtPBfpm | | 20 |
| Layer | 111 | αN-βNPAnth:3,10PCA2Nbf(IV)-02 | 1:0.015 | 25 |
| Layer | 112(3) | PCzN2 | | 10 |
| Layer | 112(2) | BBABnf | | 10 |
| Layer | 112(1) | PCBBiF | | 85 |
| Layer | 104 | PCBBiF:OCHD-003 | 1:0.03 | 10 |
| Electrode | 551X | ITSO | | 10 |
| Reflective film | REF | Ag | | 100 |

[Chemical Formulae 3]
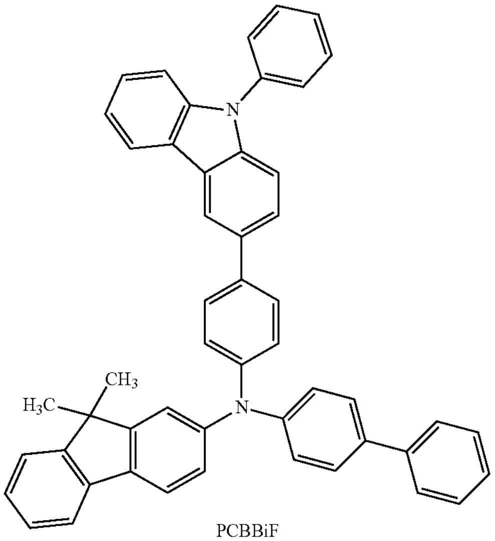
PCBBiF
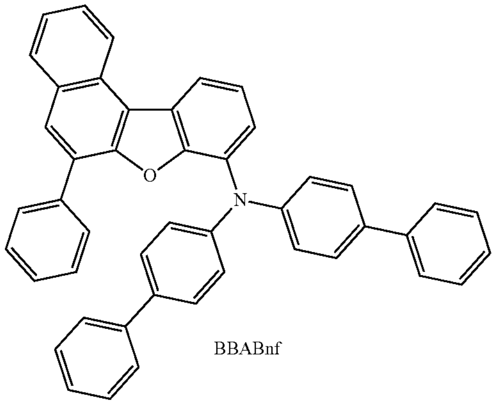
BBABnf
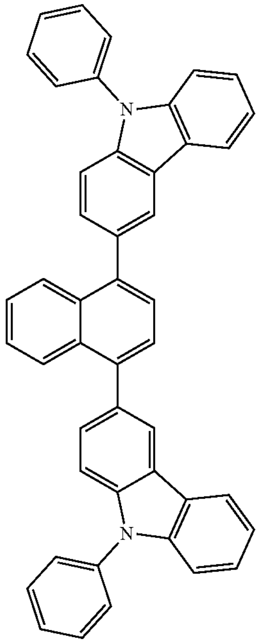
PCzN2
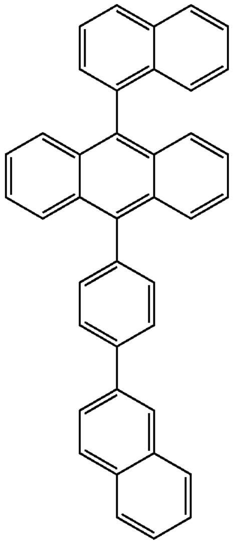
α N– β NPAnth
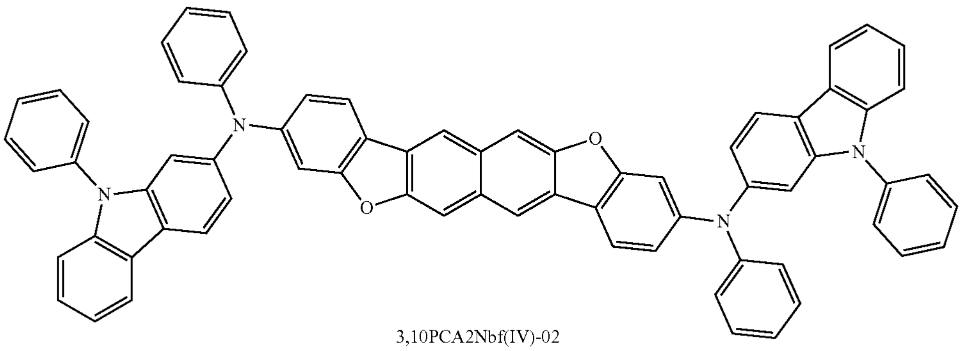
3,10PCA2Nbf(IV)-02

-continued

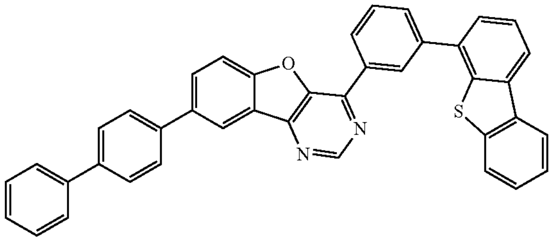

8BP-4mDBtPBfpm

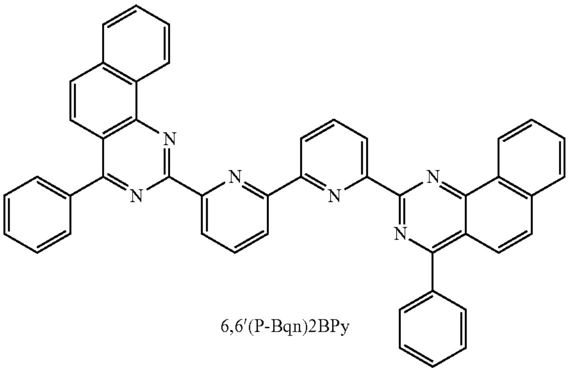

6,6'(P-Bqn)2BPy

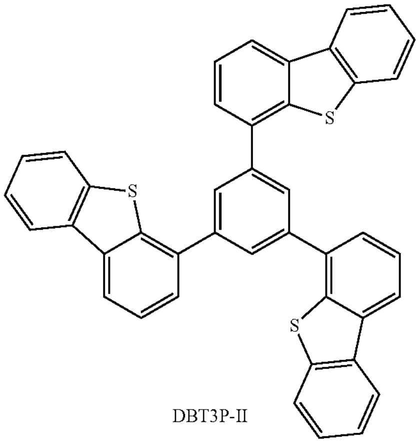

DBT3P-II

<<Method for Fabricating Light-Emitting Device 1>>

The light-emitting device 1 described in this example was fabricated using a method including the following steps.

[First Step]

In the first step, a reflective film REF was formed, specifically by a sputtering method using silver (abbreviation: Ag) as a target.

The reflective film REF includes Ag and has a thickness of 100 nm.

[Second Step]

In the second step, the electrode 551X was formed over the reflective film REF, specifically by a sputtering method using indium oxide-tin oxide containing silicon or silicon oxide (abbreviation: ITSO) as a target.

The electrode 551X includes ITSO and has a thickness of 10 nm and an area of 4 $mm^2$ (2 mm×2 mm).

Next, a base over which the electrode 551X was formed was washed with water, baked at 200° C. for one hour, and then subjected to UV ozone treatment for 370 seconds.

Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Third Step]

In the third step, the layer 104 was formed over the electrode 551X. Specifically, materials of the layer 104 were co-deposited by a resistance-heating method.

The layer 104 includes N-(1,1'-biphenyl-4-yl)-N-[4-(9-phenyl-9H-carbazol-3-yl)phenyl]-9,9-dimethyl-9H-fluoren-2-amine (abbreviation: PCBBiF) and an electron acceptor material (abbreviation: OCHD-003) at PCBBiF:OCHD-003=1:0.03 in a weight ratio and has a thickness of 10 nm. Note that OCHD-003, which is an electron-accepting material, contains fluorine, and has a molecular weight of 672.

[Fourth Step]

In the fourth step, a layer 112(1) was formed over the layer 104. Specifically, a material of the layer 112(1) was deposited by a resistance-heating method.

The layer 112(1) contains PCBBiF and has a thickness of 85 nm.

[Fifth Step]

In the fifth step, a layer 112(2) was formed over the layer 112(1). Specifically, a material of the layer 112(2) was deposited by a resistance-heating method.

The layer 112(2) contains N,N-bis(4-biphenyl)-6-phenylbenzo[b]naphtho[1,2-d]furan-8-amine (abbreviation: BBABnf) and has a thickness of 10 nm.

[Sixth Step]

In the sixth step, a layer 112(3) was formed over the layer 112(2). Specifically, a material of the layer 112(3) was deposited by a resistance-heating method.

The layer 112(3) contains 3,3'-(naphthalene-1,4-diyl)bis(9-phenyl-9H-carbazole) (abbreviation: PCzN2) and has a thickness of 10 nm.

[Seventh Step]

In the seventh step, the layer 111 was formed over the layer 112(3). Specifically, materials of the layer 111 were co-deposited by a resistance-heating method.

The layer 111 contains 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02) at αN-βNPAnth: 3,10PCA2Nbf(IV)-02=1:0.015 in a weight ratio and has a thickness of 25 nm.

[Eighth Step]

In the eighth step, a layer 113(1) was formed over the layer 111. Specifically, a material of the layer 113(1) was deposited by a resistance-heating method.

The layer 113(1) contains 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) and has a thickness of 20 nm.

[Ninth Step]

In the ninth step, a layer 113(2) was formed over the layer 113(1). Specifically, materials of the layer 113(2) were co-deposited by a resistance-heating method.

The layer 113(2) contains 2,2'-(2,2'-bipyridine-6,6'-diyl) bis(4-phenylbenzo[h]quinazoline (abbreviation: 6,6'(P-Bqn) 2BPy) and has a thickness of 20 nm.

[Tenth Step]

In the tenth step, the layer 105 was formed over the layer 113(2). Specifically, a material of the layer 105 was deposited by a resistance-heating method.

The layer 105 includes lithium fluoride (abbreviation: LiF) and has a thickness of 1 nm.

[Eleventh Step]

In the eleventh step, the electrode 552X was formed over the layer 105. Specifically, materials of the electrode 552X were co-deposited by a resistance-heating method.

The electrode 552X includes Ag and Mg at Ag:Mg=1:0.1 in a volume ratio and has a thickness of 15 nm.

[Twelfth Step]

In the twelfth step, a layer CAP was formed over the electrode 552X. Specifically, a material of the layer CAP was deposited by a resistance-heating method.

The layer CAP includes 4,4',4"-(benzene-1,3,5-triyl)tri (dibenzothiophene) (abbreviation: DBT3P-II) and has a thickness of 80 nm.

<<Operation Characteristics of Light-Emitting Device 1>>

When supplied with electric power, the light-emitting device 1 emitted the light EL1 (see FIG. 17). Operation characteristics of the light-emitting device 1 were measured at room temperature (see FIG. 18 to FIG. 23). Note that luminance, CIE chromaticity, and emission spectra were measured with a spectroradiometer (SR-UL1R manufactured by TOPCON TECHNOHOUSE CORPORATION).

Table 2 shows main initial characteristics of the fabricated light-emitting device emitting light at a luminance of approximately 1000 cd/$m^2$. Table 2 also shows main characteristics of the fabricated light-emitting device emitting light at a luminance of approximately 1000 cd/$m^2$ after heat treatment was performed at 120° C. for one hour. Table 2 also shows the characteristics of another light-emitting device having a structure described later.

Note that the blue index (BI) is one of the indicators of characteristics of a blue light-emitting device, and is a value obtained by dividing current efficiency (cd/A) by chromaticity y. In general, blue light with high color purity is useful in expressing a wide color gamut. In addition, blue light with higher color purity tends to have lower chromaticity y. Thus, a value obtained by dividing current efficiency (cd/A) by chromaticity y is the indicator of usefulness of a blue light-emitting device. In other words, a blue light-emitting device with a large BI is suitable for providing a highly efficient display device capable of displaying an image with a wide color gamut.

TABLE 2

| | Voltage (V) | Current (mA) | Current density (mA/cm2) | Chromaticity x | Chromaticity y | Current efficiency (cd/A) | B.I. (cd/A/y) |
|---|---|---|---|---|---|---|---|
| Light-emitting device 1 | 5.4 | 0.62 | 15.6 | 0.13 | 0.07 | 7.0 | 10.6 |
| Light-emitting device 1 (heat treatment) | 4.6 | 0.47 | 11.6 | 0.13 | 0.06 | 9.3 | 15.5 |
| Comparative device | 5.4 | 0.44 | 11.0 | 0.13 | 0.07 | 6.7 | 10.2 |
| Comparative device (heat treatment) | 5.4 | 0.66 | 16.5 | 0.13 | 0.07 | 6.3 | 9.7 |

The light-emitting device 1 was found to have favorable characteristics. For example, the light-emitting device 1 has high current efficiency. In addition, the characteristics of the light-emitting device 1 were hardly changed even after the device was subjected to the heat treatment at 120° C. for one hour. The light-emitting device 1 that has no change in characteristics even after subjected to the heat treatment at 120° C. for one hour can be regarded as a device that is stable in heat treatment.

In contrast, the characteristics of the comparative device were changed due to the heat treatment performed on the device at 120° C. for one hour. Specifically, the luminance-current efficiency characteristics in FIG. 19 and the voltage-luminance characteristics in FIG. 20 are shifted to the higher voltage side. In addition, in the current density-luminance characteristics in FIG. 18, the current efficiency increases in a high-luminance region. Such changes in the characteristics are probably derived from, for example, a change in the balance of carriers transferred in the comparative device.

Note that the comparative device is different from the light-emitting device 1 in the structure of the layer 113(2). Thus, the change in the characteristics of the comparative device due to the heat treatment performed on the device at 120° C. for one hour is probably due to the structure of the layer 113(2).

Specifically, the comparative device is different from the light-emitting device 1 in using 2,9-di(naphthalen-2-yl)-4,7-diphenyl-1,10-phenanthroline (abbreviation: NBPhen) instead of 6,6'(P-Bqn)2BPy. In the graph in which the second normalized principal moment of inertia NPR2 is plotted with respect to the first normalized principal moment of inertia NPR1, the first normalized principal moment of inertia NPR1 and the second normalized principal moment of inertia NPR2 of 6,6'(P-Bqn)2BPy are positioned in a predetermined region (see FIG. 24). Meanwhile, the first normalized principal moment of inertia NPR1 and the second normalized principal moment of inertia NPR2 of NBPhen are positioned outside the predetermined region; thus, NBPhen is considered to cause the change in the characteristics of the comparative device due to the heat treatment.

Reference Example

The fabricated comparative device, which is described in this reference example, has a structure similar to that of the light-emitting device 550 (see FIG. 17).

<<Structure of Comparative Device>>

Table 1 shows the structure of the comparative device. The comparative device is different from the light-emitting device 1 in using NBPhen for the layer 113(2) instead of 6,6'(P-Bqn)2BPy. A structural formula of NBPhen is shown below.

[Chemical Formula 4]

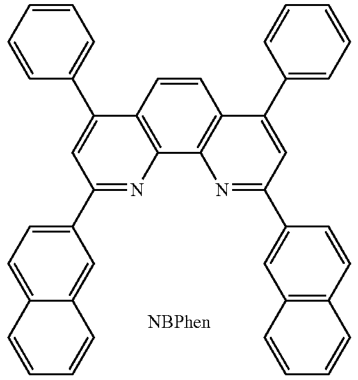

NBPhen

<<Method for Fabricating Comparative Device>>

The comparative device described in this reference example was fabricated by a method including the following steps. The method for fabricating the comparative device is different from the method for fabricating the light-emitting device 1 in using NBPhen instead of 6,6'(P-Bqn)2BPy in the step of forming the layer 113(2). Different portions will be described in detail below, and the above description is referred to for portions where a method similar to the above was employed.

[Ninth Step]

In the ninth step, the layer 113(2) was formed over the layer 113(1). Specifically, a material of the layer 113(2) was deposited by a resistance-heating method.

The layer 113(2) contains NBPhen and has a thickness of 20 nm.

Example 2

In this example, films containing respective organic compounds HRM that can be used for a light-emitting device of one embodiment of the present invention are described with reference to FIG. 24 and FIG. 25.

<Films Containing Organic Compounds HRM>

Note that the films described in this example contain 8BP-4mDBtPBfpm, 6,6'(P-Bqn)2BPy, 4,4'-di(1,10-phenanthrolin-2-yl)biphenyl (abbreviation: Phen2BP), and 2,2'-(1,1'-biphenyl)-4,4'-diylbis(9-phenyl-1,10-phenanthroline) (abbreviation: PPhen2BP). Structural formulae of Phen2BP and PPhen2BP among the above-described organic compounds HRM are shown below.

[Chemical Formulae 5]

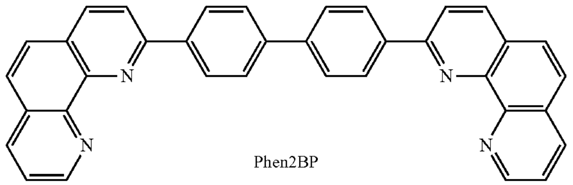

Phen2BP

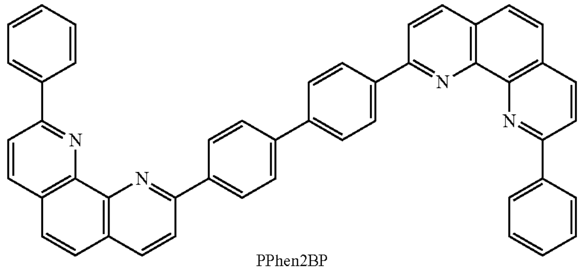

PPhen2BP

Table 3 shows parameters of the organic compounds HRM contained in the films described in this example. Specifically, Table 3 shows the numbers of rotatable bonds RB, first normalized principal moments of inertia NPR1, second normalized principal moments of inertia NPR2, polar surface areas PSA, molecular weights MW, and transition temperatures.

TABLE 3

| | RB | NPR1 | NPR2 | PSA | MW | Transition temperature ° C. |
|---|---|---|---|---|---|---|
| 8BP-4mDBtPBfpm | 4 | 0.066528 | 0.962020 | 38.92 | 580.712 | 142.1 |
| 6,6'(P-Bqn)2BPy | 5 | 0.148595 | 0.855857 | 77.34 | 664.772 | 152.5 |
| Phen2BP | 3 | 0.072083 | 0.936008 | 51.56 | 510.600 | 151.3 |
| PPhen2BP | 5 | 0.127151 | 0.895500 | 51.56 | 662.796 | 159.0 |

The second normalized principal moments of inertia NPR2 were plotted using white circles with respect to the first normalized principal moments of inertia NPR1 of the respective organic compounds HRM (see FIG. 24). Each organic compound HRM has the first normalized principal moment of inertia NPR1 and the second normalized principal moment of inertia NPR2 in a predetermined region surrounded by straight lines represented by Formulae (1) to (4) below.

[Formulae 4]

$$NPR2 \leq NPR1+0.95 \quad (1)$$

$$NPR2 \geq NPR1+0.65 \quad (2)$$

$$NPR2 \leq -NPR1+1.05 \quad (3)$$

$$NPR2 \geq -NPR1+1.00 \quad (4)$$

Note that the principal moment of inertia of the organic compound HRM was calculated using RDKit (Sep. 3, 2019), which is the open source software.

<<Evaluation Method of Films>>

Physical properties of the films containing the respective organic compounds HRM described in this example were evaluated by the following method.

As software for the classical molecular dynamics calculation, LAMMPS developed by Sandia National Laboratories was used. As potentials, Dreiding and UFF were used for intramolecular interaction and intermolecular interaction, respectively. A cutoff distance was 1 nm and an ensemble was NTP. Note that a high performance computer (SGI8600 manufactured by Hewlett Packard Japan, G.K.) was used for the calculation.

As a calculation model, a standard cell containing 100 molecules was used. As the initial structure of the molecule structure of each material, the most stable structure (singlet ground state) obtained from the first-principles calculation was used. The electric charge distribution of each molecule was obtained by performing electrostatic potential approximation on the basis of the results obtained from the first-principles calculation, and it was set as "atomic charges".

For the first-principles calculation, Gaussian 09, which is the quantum chemistry computational program, was used, and the most stable structure in the singlet ground state was calculated by the density functional theory (DFT). As a basis function, 6-311G(d,p) was used, and as a functional, B3LYP was used. Note that the high performance computer (SGI8600 manufactured by Hewlett Packard Japan, G.K.) was used for the calculation.

The above initial structure was subjected to calculation for a relaxation time of 0.8 ns which is sufficient relative to time intervals of 0.2 fs that reproduce molecular vibration; thus, an amorphous solid was obtained.

Next, the obtained amorphous solid was subjected to calculation while temperature was increased from 298 K to 600 K over a time scale of 1.2 ns and calculation while temperature was decreased from 600 K to 298 K over a time scale of 1.2 ns, so that temperature in the system and a bulking value were tracked.

The moving average for sufficient class intervals (500) of each of the obtained temperature and the obtained bulking value was calculated, and was plotted in a graph in which the vertical axis represents volume and the horizontal axis represents temperature. One approximate straight line was drawn in a region representing a temperature lower than a temperature at which the inclination of the plot changes (transition temperature), another approximate straight line was drawn in a region representing a temperature higher than the transition temperature, and the coordinate of an intersection point of the two approximate straight lines was obtained, whereby the transition temperature of the material was calculated.

The calculated transition temperature of the amorphous solid is close to the glass transition temperature of powder that was measured using a differential scanning calorimeter (DSC), which indicates that this calculation is appropriate.

Next, the transition temperature of a structure in which, unlike in the amorphous solid, an electric field was applied to aggregating molecules so that the molecules are uniformly aligned in the same direction (in this specification, this structure is referred to as an aggregation to which an electric field was applied) was also calculated. In the above-described initial structure, an electric field was applied at an intensity of 1 V/A in the x direction to molecules at time intervals of 0.2 fs that reproduce molecular vibration, and after letting 0.6 ns elapse at 1 atm and 298 K, an aggregation was obtained. After that, application of the electric field was stopped, and then a relaxation time of 0.2 ns was taken at 1 atm and 298 K. It was confirmed that in the aggregation to which an electric field was applied and which was obtained through the above-described method, dipole moments tend to be arranged in an x-axis direction as compared with the amorphous solid. In addition, an intermolecular stacking structure composed of several molecules was observed.

Calculation on an evaporated film was separately performed, and an intermolecular stacking structure composed of several molecules was observed also in this case, which indicates that the aggregation to which an electric field was applied is similar to the evaporated film.

Next, the obtained aggregation to which an electric field was applied was subjected to calculation while temperature was increased from 298 K to 600 K over a time scale of 1.2 ns and calculation while temperature was decreased from 600 K to 298 K over a time scale of 1.2 ns, so that temperature in the system and a bulking value were tracked.

The moving average for sufficient class intervals (500) of each of the obtained temperature and the obtained bulking value was calculated, and was plotted in the graph in which the vertical axis represents volume and the horizontal axis represents temperature. One approximate straight line was drawn in a region representing a temperature lower than a temperature at which the inclination of the plot changes (transition temperature), another approximate straight line was drawn in a region representing a temperature higher than the transition temperature, and the coordinate of an intersection point of the two approximate straight lines was obtained, whereby the transition temperature of the material was calculated.

FIG. 25 is a graph showing the calculated transition temperatures of an amorphous solid and an aggregation to which an electric field was applied of 2,9-di(naphthalen-2-yl)-4,7-diphenyl-1,10-phenanthroline (abbreviation: NBPhen) as an example.

<<Characteristics of Films>>

The transition temperatures of aggregations to which an electric field was applied of the organic compounds HRM each having the first normalized principal moment of inertia NPR1 and the second normalized principal moment of inertia NPR2 in the predetermined region surrounded by the straight lines represented by Formulae (1) to (4) above (see FIG. 24) were calculated. As shown in Table 3, the organic compounds HRM each had a transition temperature of higher than or equal to 140° C.

The transition temperatures of aggregations to which an electric field was applied of organic compounds each having the first normalized principal moment of inertia NPR1 and the second normalized principal moment of inertia NPR2 outside the predetermined region surrounded by the straight lines represented by Formulae (1) to (4) above were also calculated. As shown in Table 4, the organic compounds each had a transition temperature of lower than 140° C.

Reference Example

Films described in this reference example each contain NBPhen, 2,2'-(1,3-phenylene)bis[9-phenyl-1,10-phenanthroline] (abbreviation: mPPhen2P), 2-[(1,1'-biphenyl)-4-yl]-4-phenyl-6-[9,9'-spirobi(9H-fluoren)-2-yl]-1,3,5-triazine (abbreviation: BP-SFTzn), 2-[3-(2,6-dimethyl-3-pyridinyl)-5-(9-phenanthrenyl)phenyl]-4,6-diphenyl-1,3,5-triazine (abbreviation: mPn-mDMePyPTzn), or 4-[3,5-bis(9H-carbazol-9-yl)phenyl]-2-phenyl-6-(1,1'-biphenyl-4-yl)pyrimidine (abbreviation: 6BP-4Cz2PPm). Structural formulae of mPPhen2P, BP-SFTzn, mPn-mDMePyPTzn, and 6BP-4Cz2PPm among the above-described organic compounds are shown below.

[Chemical Formulae 6]

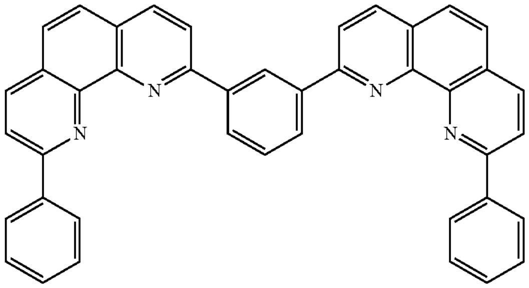

mPPhen2P

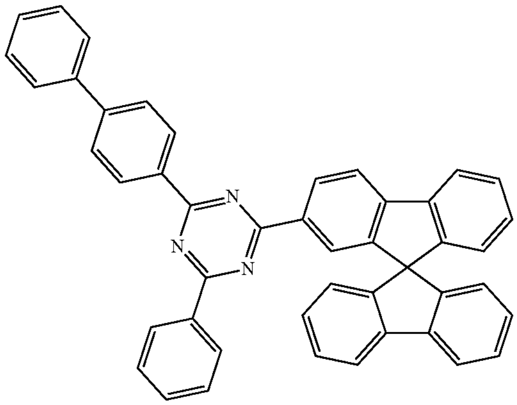

BP-SFTzn

-continued

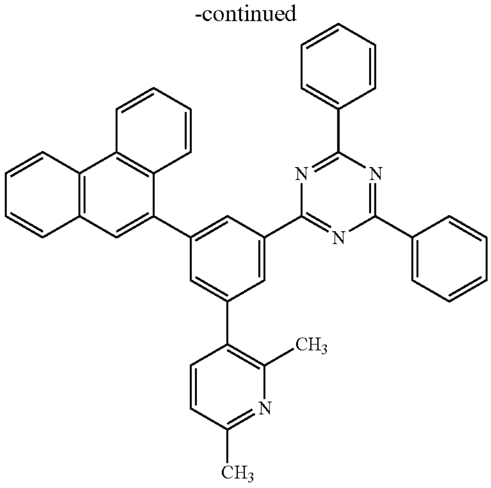

mPn-mDMePyPTzn

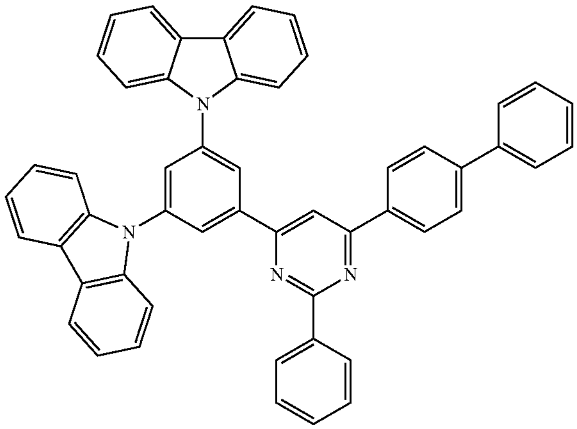

6BP-4Cz2PPm

Table 4 shows parameters of the organic compounds contained in the films described in this reference example. Specifically, Table 4 shows the numbers of rotatable bonds RB, first normalized principal moments of inertia NPR1, second normalized principal moments of inertia NPR2, polar surface areas PSA, molecular weights MW, and transition temperatures.

TABLE 4

| | RB | NPR1 | NPR2 | PSA | MW | Transition temperature ° C. |
|---|---|---|---|---|---|---|
| NBPhen | 4 | 0.468890 | 0.539455 | 25.78 | 584.722 | 138.3 |
| mPPhen2P | 4 | 0.204650 | 0.795350 | 51.56 | 586.698 | 135.6 |
| BP-SFTzn | 4 | 0.394096 | 0.692070 | 38.67 | 623.759 | 120.3 |
| mPn-mDMePyPTzn | 5 | 0.423045 | 0.623148 | 51.56 | 590.730 | 132.0 |
| 6BP-4Cz2PPm | 6 | 0.393814 | 0.721413 | 35.64 | 714.872 | 136.8 |

The second normalized principal moments of inertia NPR2 were plotted using black circles with respect to the first normalized principal moments of inertia NPR1 of the respective organic compounds (see FIG. 24). Each organic compound has the first normalized principal moment of inertia NPR1 and the second normalized principal moment of inertia NPR2 outside the predetermined region surrounded by the straight lines represented by Formulae (1) to (4) above.

This application is based on Japanese Patent Application Serial No. 2021-105470 filed with Japan Patent Office on Jun. 25, 2021, the entire contents of which are hereby incorporated by reference.

What is claimed is:

1. A photoelectric conversion device comprising:

a first electrode;

a second electrode; and an electron-donating material, an electron-accepting material, and an organic compound between the first electrode and the second electrode, wherein the organic compound comprises four or more rotatable bonds, wherein the organic compound comprises a principal moment of inertia, wherein the principal moment of inertia comprises a first normalized principal moment of inertia NPR1 and a second normalized principal moment of inertia NPR2, wherein the first normalized principal moment of inertia NPR1 and the second normalized principal moment of inertia NPR2 are in a region surrounded by straight lines represented by formulae shown below:

$$NPR2 \leq NPR1 + 0.95 \quad (1)$$

$$NPR2 \geq NPR1 + 0.65 \quad (2)$$

$$NPR2 \leq -NPR1 + 1.05 \quad (3)$$

$$NPR2 \geq -NPR1 + 1.00 \quad (4)$$

wherein the first normalized principal moment of inertia NPR1 and the second normalized principal moment of inertia NPR2 are values obtained by dividing elements other than a largest element of the principal moment of inertia by the largest element, and wherein the second normalized principal moment of inertia NPR2 is greater than or equal to the first normalized principal moment of inertia NPR1.

2. The photoelectric conversion device according to claim 1, wherein the organic compound comprises a polar surface area of 30 Å$^2$ or larger.

3. A photoelectric conversion device comprising:

a first electrode;

a second electrode; and a first layer, a second layer, and a third layer between the first electrode and the second electrode, wherein the first layer is between the second layer and the third layer, wherein the first layer comprises an electron-donating material and an electron-accepting material, wherein the third layer is between the second electrode and the first layer, and wherein the third layer comprises an organic compound, wherein the organic compound comprises four or more rotatable bonds, wherein the organic compound comprises a principal moment of inertia, wherein the organic compound comprises a polar surface area of 30 Å$^2$ or larger, wherein the principal moment of inertia comprises a first normalized principal moment of inertia NPR1 and a second normalized principal moment of inertia NPR2, wherein the first normalized principal moment of inertia NPR1 and the second normalized principal moment of inertia NPR2 are in a region surrounded by straight lines represented by formulae shown below:

$$NPR2 \leq NPR1 + 0.95 \quad (1)$$

$$NPR2 \geq NPR1 + 0.65 \quad (2)$$

$$NPR2 \leq -NPR1 + 1.05 \quad (3)$$

$$NPR2 \geq -NPR1 + 1.00 \quad (4)$$

wherein the first normalized principal moment of inertia NPR1 and the second normalized principal moment of inertia NPR2 are values obtained by dividing elements other than a largest element of the principal moment of inertia by the largest element, and wherein the second normalized principal moment of inertia NPR2 is greater than or equal to the first normalized principal moment of inertia NPR1.

4. The photoelectric conversion device according to claim 3, wherein the organic compound has a molecular weight of greater than or equal to 550 and less than or equal to 850.

* * * * *